US012568647B2

(12) United States Patent
Chen et al.

(10) Patent No.: US 12,568,647 B2
(45) Date of Patent: Mar. 3, 2026

(54) BIRD'S BEAK PROFILE OF FIELD OXIDE REGION

(71) Applicant: TEXAS INSTRUMENTS INCORPORATED, Dallas, TX (US)

(72) Inventors: Jingjing Chen, San Jose, CA (US); Ming-Yeh Chuang, McKinney, TX (US); Guruvayurappan Mathur, Allen, TX (US); James Todd, Plano, TX (US); Ronald Chin, Dallas, TX (US); Thomas Lillibridge, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 582 days.

(21) Appl. No.: 17/665,381

(22) Filed: Feb. 4, 2022

(65) Prior Publication Data

US 2023/0253495 A1     Aug. 10, 2023

(51) Int. Cl.
H01L 21/762     (2006.01)
H10D 30/01     (2025.01)
(Continued)

(52) U.S. Cl.
CPC ....... H10D 30/658 (2025.01); H10D 30/0215 (2025.01); H10D 64/257 (2025.01); H10D 64/513 (2025.01)

(58) Field of Classification Search
None
See application file for complete search history.

(56) References Cited

U.S. PATENT DOCUMENTS 4,909,897 A * 3/1990 Duncan ............... H01L 21/7621
                                                    438/445
5,940,720 A * 8/1999 Hong ...................... H01L 21/32
                                                    257/E21.258
(Continued)

FOREIGN PATENT DOCUMENTS

JP          2013115144 A * 6/2013

OTHER PUBLICATIONS

"Study on Poly-Buffered Locos Isolation for BCD Application" by Shao-Ming Yang et al. in 2015 IEEE 2nd International Future Energy Electronics Conference (IFEEC) (Year: 2015).*
(Continued)

*Primary Examiner* — Eric A. Ward
(74) *Attorney, Agent, or Firm* — Yudong Kim; Frank D. Cimino

(57) ABSTRACT
The present disclosure generally relates to a bird's beak profile of a field oxide region. In an example, a semiconductor device structure includes a semiconductor substrate, a dielectric oxide layer, and a field oxide region. The semiconductor substrate has a top surface. The dielectric oxide layer is over the top surface of the semiconductor substrate. The field oxide region is over the semiconductor substrate. The field oxide region is connected to the dielectric oxide layer through a bird's beak region. A lower surface of the bird's beak region interfaces with the semiconductor substrate. In a cross-section along a direction from the field oxide region to the dielectric oxide layer, the lower surface of the bird's beak region does not have a slope with a magnitude that exceeds 0.57735, where rise of the slope is in a direction normal to the top surface of the semiconductor substrate.

22 Claims, 17 Drawing Sheets

(51) Int. Cl.
    H10D 30/65      (2025.01)
    H10D 64/23      (2025.01)
    H10D 64/27      (2025.01)

(56)           References Cited

U.S. PATENT DOCUMENTS

| | | |
|---|---|---|
| 6,242,787 B1 | 6/2001 | Nakayama |
| 6,900,101 B2 | 5/2005 | Lin |
| 2006/0186467 A1* | 8/2006 | Pendharkar ........... H01L 29/749 |
| | | 257/E27.06 |
| 2009/0108347 A1* | 4/2009 | Adkisson ............. H10D 64/516 |
| | | 257/E29.256 |
| 2013/0207192 A1 | 8/2013 | Parthasarathy |
| 2019/0097044 A1* | 3/2019 | Lee ....................... H01L 21/762 |

OTHER PUBLICATIONS

PCT International Search Report mailed May 19, 2023, International application No. PCT/US2023/011744.

* cited by examiner

BIRD'S BEAK PROFILE OF FIELD OXIDE REGION

BACKGROUND

Laterally-diffused metal-oxide-semiconductor (LDMOS) transistors are a type of double-diffused metal-oxide-semiconductor field effect transistor (MOSFET). LDMOS transistors are capable of being implemented in high voltage and/or high power applications. However, continued scaling of semiconductor device sizes to smaller and smaller dimensions has raised challenges in LDMOS transistors.

SUMMARY

An example described herein is a semiconductor device structure. The semiconductor device structure includes a semiconductor substrate, a dielectric oxide layer, and a field oxide region. The semiconductor substrate has a top surface. The dielectric oxide layer is over the top surface of the semiconductor substrate. The field oxide region is over the semiconductor substrate. The field oxide region is connected to the dielectric oxide layer through a bird's beak region. A lower surface of the bird's beak region interfaces with the semiconductor substrate. In a cross-section along a direction from the field oxide region to the dielectric oxide layer, the lower surface of the bird's beak region does not have a slope with a magnitude that exceeds 0.57735, where rise of the slope is in a direction normal to the top surface of the semiconductor substrate.

Another example is a method of semiconductor processing. A pad oxide layer is formed over a top surface of a semiconductor substrate. A patterned mask is formed over the pad oxide layer. A field oxide region is formed using an oxidation process. The field oxide region is formed through an opening through the patterned mask. A portion of the pad oxide layer is exposed through the opening, and the oxidation process is performed through the portion of the pad oxide layer. A dielectric oxide layer is formed over the top surface of the semiconductor substrate. The field oxide region is connected to the dielectric oxide layer through a bird's beak region.

A further example is a semiconductor device structure. The semiconductor device structure includes a semiconductor substrate, a dielectric oxide layer, and a field oxide region. The semiconductor substrate has a top surface. The dielectric oxide layer is over the top surface of the semiconductor substrate. The field oxide region is over the semiconductor substrate. The field oxide region has an edge region extending to and connected to the dielectric oxide layer. A lower oxide surface of the edge region interfaces with the semiconductor substrate. The lower oxide surface has a first point and a second point. The first point is on a field oxide side of the edge region and has a tangent line with respect to the lower oxide surface that is parallel with the top surface of the semiconductor substrate. The second point is on a dielectric oxide layer side of the edge region and has a tangent line with respect to the lower oxide surface that is parallel with the top surface of the semiconductor substrate. In a cross-section along a direction from the field oxide region to the dielectric oxide layer, no pair of points on the lower oxide surface between the first point and the second point have respective tangent lines with respect to the lower oxide surface that intersect at an angle opening to the semiconductor substrate that is less than 150°.

The foregoing summary outlines rather broadly various features of examples of the present disclosure in order that the following detailed description may be better understood. Additional features and advantages of such examples will be described hereinafter. The described examples may be readily utilized as a basis for modifying or designing other examples that are within the scope of the appended claims.

BRIEF DESCRIPTION OF THE DRAWINGS

So that the manner in which the above recited features can be understood in detail, reference is made to the following detailed description taken in conjunction with the accompanying drawings.

Figure 1A:
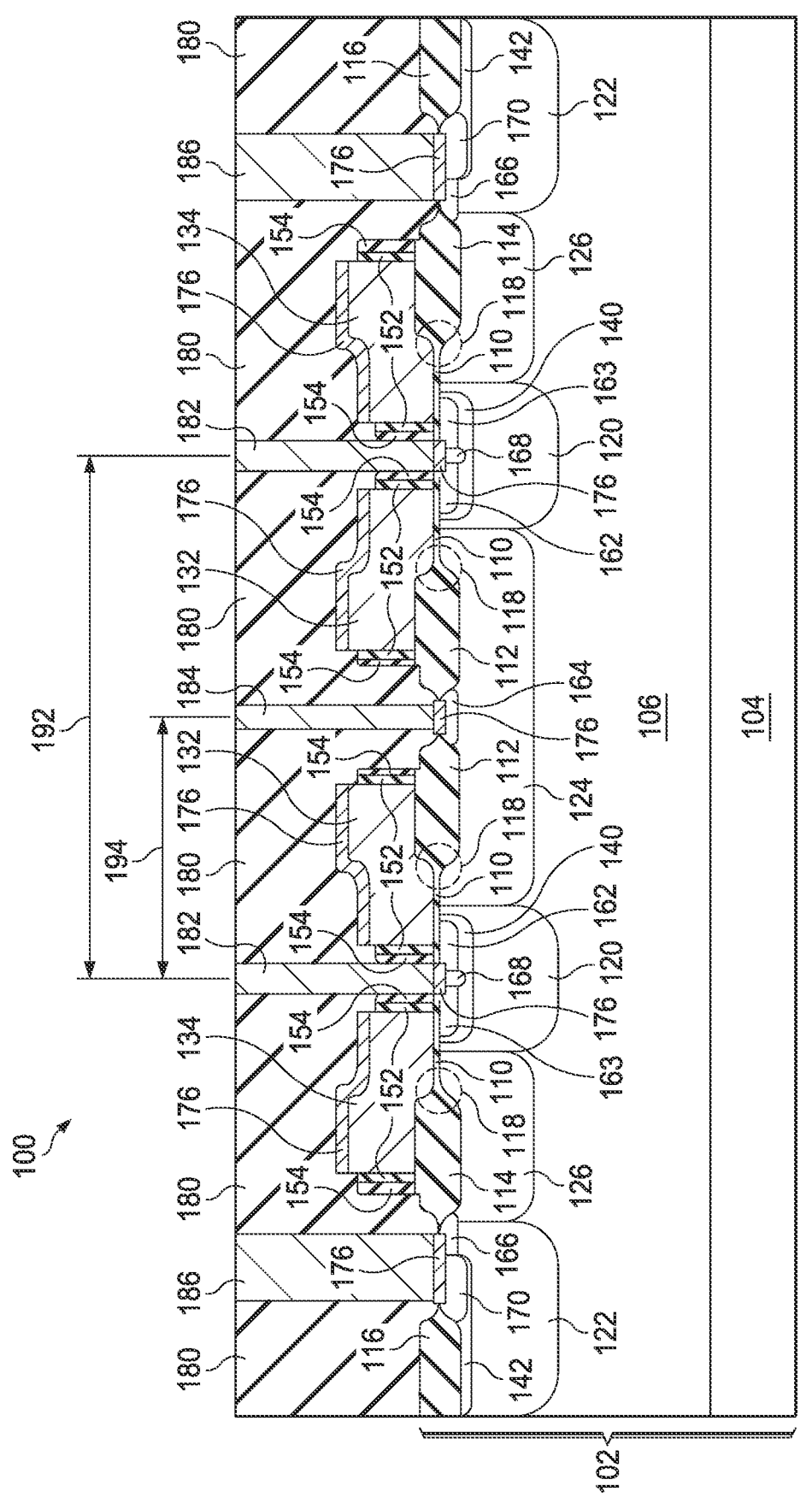
FIGS. 1A and 1B are a cross-sectional view and a layout view, respectively, of a semiconductor device structure according to some examples.

The drawings, and accompanying detailed description, are provided for understanding of features of various examples and do not limit the scope of the appended claims. The examples illustrated in the drawings and described in the accompanying detailed description may be readily utilized as a basis for modifying or designing other examples that are within the scope of the appended claims. Identical reference numerals may be used, where possible, to designate identical elements that are common among drawings. The figures are drawn to clearly illustrate the relevant elements or features and are not necessarily drawn to scale.

DETAILED DESCRIPTION

Various features are described hereinafter with reference to the figures. An illustrated example may not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

The present disclosure relates to a bird's beak profile, where the bird's beak profile extends from a field oxide region to a dielectric oxide layer. In some examples, the field oxide region and dielectric oxide layer are implemented in a laterally-diffused metal-oxide-semiconductor (LDMOS) transistor structure. The bird's beak region has a lower surface that interfaces with a semiconductor substrate, and the lower surface is generally smooth. In some examples, the lower surface does not have sharp angles, such as between 90° and 120°. In some examples, in a cross-section along a direction from the field oxide region to the dielectric oxide layer, the lower surface does not have a slope (e.g., of a tangent line) with a magnitude that exceeds 0.57735 (e.g., $\sqrt{3}/3$). In some examples, no pair of points along the lower surface have tangent lines that intersect to form an angle facing downward towards the semiconductor substrate that is less than 150°.

In LDMOS technologies, pitch reduction is a mechanism for improving specific on-resistance (Rsp). However, reducing the pitch can result in reduced breakdown voltage (BV)

and increased challenges in addressing channel hot carrier (CHC) and safe operating area (SOA) issues. Also, the LDMOS device can become more susceptible to stress induced process variability.

In an LDMOS transistor implementing the field oxide region with the bird's beak region to the dielectric oxide layer generally described above, an electric field at the bird's beak region can be reduced relative to another bird's beak region having a sharp angle. Also, impact ionization can be reduced. CHC effect can be reduced, and SOA can be increased. The BV can therefore be increased for a given pitch. Conversely, for a given BV, a pitch, and hence, a Rsp, can be reduced. Further, using processing described in some examples below, stress induced process variation can be reduced. Other advantages or benefits can be achieved using various aspects described herein. Due to the specific advantages of the above field oxide with bird's beak profile to LDMOS transistors, an example field oxide with the bird's beak profile will be described in the context of a LDMOS transistor. It will be apparent to those of ordinary skill in the art that the field oxide with the above described bird's beak profile is may alternatively be applied to other devices.

Figure 1B:
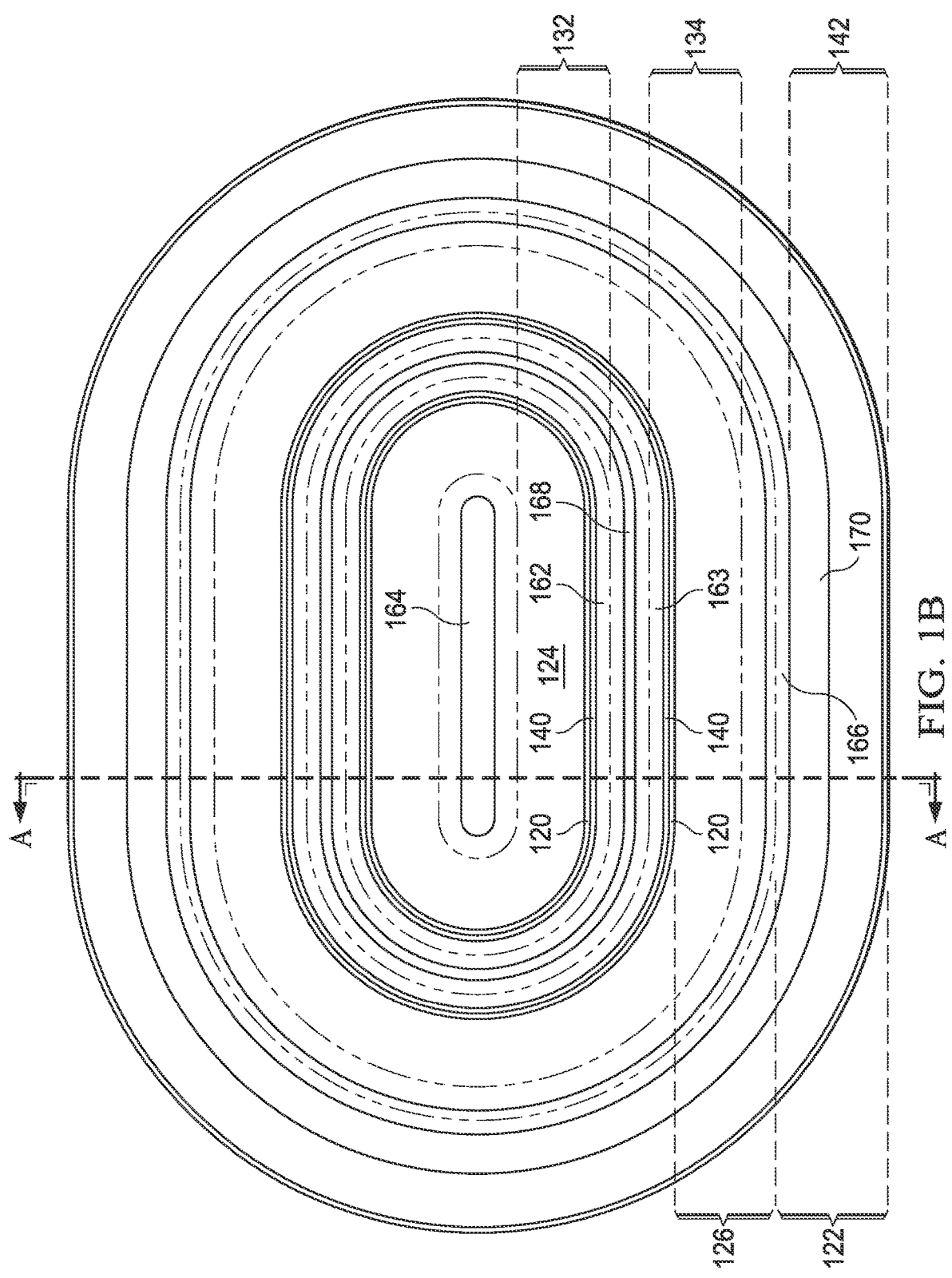

FIG. 1A is a cross-sectional view of a semiconductor device structure 100 according to some examples. FIG. 1B is a layout view of components of the semiconductor device structure 100 of FIG. 1A according to some examples. FIG. 1B shows cross-section A-A that is illustrated in FIG. 1A. Some examples include an integrated circuit that includes the device structure 100.

The semiconductor device structure 100, in this example, is or includes a LDMOS transistor, which may be in a colloquial lateral "racetrack" configuration as shown in FIG. 1B. The LDMOS transistor of the semiconductor device structure 100 of FIGS. 1A and 1B is described below as an n-channel LDMOS transistor. In other examples, the LDMOS transistor can be a p-channel LDMOS transistor. Some aspects of the semiconductor device structure 100 are shown generically so as to not obscure aspects described herein. Additionally, an LDMOS transistor can be in a number of different configurations, and the LDMOS transistor shown in FIGS. 1A and 1B is merely an example to illustrate various aspects described herein.

The semiconductor device structure 100 includes a semiconductor substrate 102. The semiconductor substrate 102, in the illustrated example, includes a support substrate 104 and an epitaxial layer 106. The support substrate 104 can be a bulk semiconductor substrate, a semiconductor-on-insulator (SOI) substrate, or any other appropriate substrate. The epitaxial layer 106 is epitaxially grown over the support substrate 104. The epitaxial layer 106 can be or include silicon (Si), silicon germanium (SiGe), gallium arsenide (GaAs), gallium nitride (GaN), the like, or a combination thereof. In some examples, the support substrate 104 is or includes a silicon substrate (which may be singulated from a bulk silicon wafer at the conclusion of semiconductor processing), and the epitaxial layer 106 is or includes a layer of silicon. In some examples, the epitaxial layer 106 can be omitted, and a semiconductor material of the semiconductor substrate 102 (e.g., in or on which devices are formed) can be or include silicon (Si), silicon germanium (SiGe), gallium arsenide (GaAs), gallium nitride (GaN), the like, or a combination thereof.

A dielectric oxide layer 110 and field oxide regions 112, 114, 116 are disposed over the semiconductor substrate 102 (e.g., at a surface of the epitaxial layer 106, as illustrated). The dielectric oxide layer 110 and field oxide regions 112, 114, 116 are formed, in some examples, by oxidizing the semiconductor substrate 102, as detailed below. A bird's beak region 118 extends from a respective field oxide region 112, 114 to a respective dielectric oxide layer 110. More details of the bird's beak region 118 are described subsequently. In some examples, the field oxide region 116 may be a different type of isolation region, such as a shallow trench isolation (STI).

Counter-wells 120, 122 are disposed in the semiconductor substrate 102 (e.g., in the epitaxial layer 106, as illustrated). The counter-well 120 is generally disposed laterally between the field oxide regions 112, 114 and respective dielectric oxide layers 110 where a source region is disposed, and the counter-well 122 is generally disposed laterally outwardly from the field oxide region 114 and at least partially underlying the field oxide region 116. The counter-well 120 is disposed at least partially underlying the dielectric oxide layer 110 that extends from the field oxide region 112 and at least partially underlying the dielectric oxide layer 110 that extends from the field oxide region 114. In the n-channel LDMOS, the counter-wells 120, 122 can each be a p-well doped with a p-type dopant (e.g., boron) at a concentration in a range from about $5 \times 10^{17}$ cm$^{-3}$ to about $8 \times 10^{17}$ cm$^{-3}$.

Drift wells 124, 126 are disposed in the semiconductor substrate 102 (e.g., in the epitaxial layer 106, as illustrated). The drift well 124 is disposed laterally surrounded by and interior to the counter-well 120, and the drift well 126 is disposed laterally outwardly from the counter-well 120 and surrounded by and interior to the counter-well 122. In the cross-sectional view of FIG. 1A and/or in non-racetrack configurations, from the drift well 124 extending laterally (e.g., outwardly), the counter-well 120 is disposed between the drift wells 124, 126, and the drift well 126 is disposed between the counter-wells 120, 122. The drift well 124 is disposed underlying the field oxide region 112 and, at least partially, the dielectric oxide layer 110 to which the field oxide region 112 is connected via the respective bird's beak region 118. The drift well 124 adjoins the bird's beak region 118 extending from the field oxide region 112 to the dielectric oxide layer 110. Similarly, the drift well 126 is disposed underlying the field oxide region 114 and, at least partially, the dielectric oxide layer 110 to which the field oxide region 114 is connected via the respective bird's beak region 118. The drift well 126 adjoins the bird's beak region 118 extending from the field oxide region 114 to the dielectric oxide layer 110. The counter-wells 120, 122 are doped with a dopant that has an opposite (e.g., counter) conductivity from the dopant with which the drift wells 124, 126 are doped. In the n-channel LDMOS, the drift wells 124, 126 can each be an n-well doped with an n-type dopant (e.g., phosphorus or arsenic) at a concentration in a range from about $1 \times 10^{16}$ cm$^{-3}$ to about $1 \times 10^{17}$ cm$^{-3}$.

A gate electrode 132 is disposed over (e.g., possibly, on) the field oxide region 112 and the dielectric oxide layer 110. The gate electrode 132 is therefore disposed over the bird's beak region 118 that connects the field oxide region 112 to the dielectric oxide layer 110. Similarly, a gate electrode 134 is disposed over the field oxide region 114 and the dielectric oxide layer 110. The gate electrode 134 is therefore disposed over the bird's beak region 118 that connects the field oxide region 114 to the dielectric oxide layer 110. The dielectric oxide layer 110 may be a gate dielectric layer. The gate electrode 134 may be a dummy gate electrode. The gate electrodes 132, 134 can be or include any appropriate conductive material, such as polysilicon (e.g., doped polysilicon), metal (e.g., tungsten (W), aluminum (Al), titanium (Ti), tantalum (Ta), or the like), the like, or a combination thereof.

A Dwell 140 is disposed in the counter-well 120 extending from a top surface of the semiconductor substrate 102 to a depth in the counter-well 120 in the semiconductor substrate 102. The Dwell 140 is disposed at least partially underlying the dielectric oxide layer 110 that extends from the field oxide region 112 and at least partially underlying the dielectric oxide layer 110 that extends from the field oxide region 114. The Dwell 140 is doped with a dopant having a same conductivity type as the dopant with which the counter-well 120 is doped. In some examples, the Dwell 140 has a dopant concentration that is greater, such as by about an order of magnitude, than the dopant concentration of the counter-well 120. In some examples, the Dwell 140 can have a depth that extends to the depth of the counter-well 120 or to a deeper depth. In some examples, the Dwell 140 can have a doping concentration gradient (e.g., that is decreasing) in a direction from the top major surface of the semiconductor substrate 102 to a depth in the semiconductor substrate 102. In the n-channel LDMOS, the Dwell 140 can be p-doped with a p-type dopant at a concentration (e.g., a largest concentration in a doping concentration gradient) that can provide a target junction breakdown with the drift well 124 and can provide a target threshold voltage and SOA of the LDMOS.

Similarly, a Dwell 142 is disposed in the counter-well 122 extending from a top surface of the semiconductor substrate 102 to a depth in the counter-well 122 in the semiconductor substrate 102. The Dwell 142 is disposed at least partially underlying the field oxide region 116. The Dwell 142 is doped with a dopant having a same conductivity type as the dopant with which the counter-well 122 is doped. In some examples, the Dwell 142 has a dopant concentration that is greater, such as by about an order of magnitude, than the dopant concentration of the counter-well 122. In some examples, the Dwell 142 can have a depth that extends to the depth of the counter-well 122 or to a deeper depth. In some examples, the Dwell 142 can have a doping concentration gradient (e.g., that is decreasing) in a direction from the top major surface of the semiconductor substrate 102 to a depth in the semiconductor substrate 102. In the n-channel LDMOS, the Dwell 142 can be p-doped with a p-type dopant at a concentration (e.g., a largest concentration in a doping concentration gradient) like the Dwell 140.

Oxide layers 152 are disposed along sidewall surfaces of the gate electrodes 132, 134, and spacers 154 are disposed on the oxide layers 152 disposed along sidewall surfaces of the gate electrodes 132, 134. The spacers 154 can be or include any appropriate dielectric material, such as an oxide, a nitride, the like, or a combination thereof.

Source regions 162, 163 are disposed in the Dwell 140 extending from a top surface of the semiconductor substrate 102 to a depth in the Dwell 140 in the semiconductor substrate 102. The source regions 162, 163 are disposed laterally between the gate electrodes 132, 134. Source region 162 extends partially underlying the gate electrode 132, and source region 163 extends partially underlying the gate electrode 134. The source regions 162, 163 may form a single source region or may be separate regions, e.g., separated by an integrated backgate region. The source regions 162, 163 are doped with a dopant having an opposite conductivity type as the dopant with which the Dwell 140 is doped. In some examples, a source region 162, 163 can have a doping concentration gradient (e.g., that decreases) in a direction from laterally not underlying a respective gate electrode 132, 134 to laterally underlying the respective gate electrode 132, 134. In the n-channel LDMOS, the source regions 162, 163 can be n-doped with an n-type dopant at a concentration in a range from about $1 \times 10^{20}$ cm$^{-3}$ to about $3 \times 10^{21}$ cm$^{-3}$.

A drain region 164 is disposed in the drift well 124 extending from a top surface of the semiconductor substrate 102 to a depth in the drift well 124 in the semiconductor substrate 102. The drain region 164 is disposed laterally internal to the field oxide region 112. The field oxide region 112 and connected dielectric oxide layer 110 is disposed laterally between the source region 162 and the drain region 164. The drain region 164 is doped with a dopant having a conductivity type that is the same as the dopant with which the source region 162 and the drift well 124 are doped. A concentration of the dopant of the drain region 164 can be greater than the concentration of the dopant in the drift well 124. In the n-channel LDMOS, the drain region 164 can be n-doped with an n-type dopant at a concentration in a range from about $1 \times 10^{20}$ cm$^{-3}$ to about $1 \times 10^{21}$ cm$^{-3}$.

A drain mirror region 166 is disposed at least partially in the drift well 124 and at least partially in the counter-well 122. The drain mirror region 166 extends from a top surface of the semiconductor substrate 102 to a depth in the counter-well 122 and/or drift well 126 in the semiconductor substrate 102. The drain mirror region 166 is generally disposed laterally between the field oxide regions 114, 116. The field oxide region 114 and connected dielectric oxide layer 110 is disposed laterally between the source region 163 and the drain mirror region 166. The drain mirror region 166 is doped with a dopant having a conductivity type that is the same as the dopant with which the drift well 126 is doped and an opposite conductivity type as the dopant with which the counter-well 122 is doped. A concentration of the dopant of the drain mirror region 166 can be greater than the concentration of the dopant in the drift well 126. In the n-channel LDMOS, the drain mirror region 166 can be n-doped with an n-type dopant at a concentration in a range from about $1 \times 10^{20}$ cm$^{-3}$ to about $1 \times 10^{21}$ cm$^{-3}$.

An integrated backgate region 168 is disposed laterally between the source regions 162, 163 and in the Dwell 140. The integrated backgate region 168 extends from a top surface of the semiconductor substrate 102 to a depth in the Dwell 140 in the semiconductor substrate 102 that is greater into the semiconductor substrate 102 than the depth to which the source regions 162, 163 extend in the semiconductor substrate 102. The integrated backgate region 168 is doped with a dopant having a conductivity type that is the same as the dopant with which the Dwell 140 is doped. A concentration of the dopant of the integrated backgate region 168 can be greater than the concentration of the dopant in the Dwell 140. In the n-channel LDMOS, the integrated backgate region 168 can be p-doped with a p-type dopant at a concentration in a range from about $1 \times 10^{20}$ cm$^{-3}$ to about $1 \times 10^{21}$ cm$^{-3}$.

A backgate region 170 is disposed in the counter-well 122 and laterally adjoining the drain mirror region 166. The backgate region 170 extends from a top surface of the semiconductor substrate 102 to a depth in the counter-well 122 in the semiconductor substrate 102. The backgate region 170 is generally disposed laterally between the field oxide regions 114, 116. The backgate region 170 is doped with a dopant having a conductivity type that is the same as the dopant with which the counter-well 122 is doped and an opposite conductivity type as the dopant with which the drain mirror region 166 is doped. A concentration of the dopant of the backgate region 170 can be greater than the concentration of the dopant in the counter-well 122. In the n-channel LDMOS, the backgate region 170 can be p-doped with a p-type dopant at a concentration in a range from about $1 \times 10^{20}$ cm$^{-3}$ to about $1 \times 10^{21}$ cm$^{-3}$.

FIG. 1B shows, in a layout view of the racetrack configuration, concentric ovaloid shapes of the counter-wells 120, 122, drift wells 124, 126, Dwells 140, 142, source regions 162, 163, drain region 164, drain mirror region 166, integrated backgate region 168, and backgate region 170. FIG. 1B shows which well or region is laterally surrounded by and interior to another well or region, and which well or region is laterally outward of and surrounding another well or region. Similarly, FIG. 1B shows in phantom concentric ovaloid shapes of the gate electrodes 132, 134 in relation to the wells and/or regions. Although not specifically illustrated, the field oxide region 112 with connecting dielectric oxide layer 110 tracks the ovaloid shape of the gate electrode 132, and the field oxide region 114 with connecting dielectric oxide layer 110 tracks the ovaloid shape of the gate electrode 134.

Referring back to FIG. 1A, semiconductor-metal compound regions 176 are disposed on respective regions at a surface of the semiconductor substrate 102 and on top surfaces of the gate electrodes 132, 134. A semiconductor-metal compound region 176 is disposed on the source regions 162, 163 and integrated backgate region 168 at a surface of the semiconductor substrate 102. A semiconductor-metal compound region 176 is disposed on the drain region 164 at a surface of the semiconductor substrate 102. A semiconductor-metal compound region 176 is disposed on the drain mirror region 166 and backgate region 170 at a surface of the semiconductor substrate 102. A semiconductor-metal compound region 176 is disposed on the top surface of the gate electrode 132, and a semiconductor-metal compound region 176 is disposed on the top surface of the gate electrode 134. In some examples, the semiconductor-metal compound regions 176 can be a silicide, such as when the epitaxial layer 106 and gate electrodes 132, 134 is or includes silicon (Si). A metal of the semiconductor-metal compound regions 176 can be or include nickel (Ni), tungsten (W), molybdenum (Mo), titanium (Ti), magnesium (Mg), the like, or a combination thereof.

A dielectric layer 180 is disposed over the semiconductor substrate 102. More specifically, the dielectric layer 180 is disposed over the field oxide region 116, portions of field oxide regions 112, 114 not underlying gate electrodes 132, 134, semiconductor-metal compound regions 176, and spacers 154. The dielectric layer 180 can include multiple dielectric layers. For example, the dielectric layer 180 can include an etch stop layer (e.g., silicon nitride (SiN) or the like) disposed conformally along surfaces of, e.g., the field oxide region 116, portions of field oxide regions 112, 114 not underlying gate electrodes 132, 134, the semiconductor-metal compound regions 176, and the spacers 154, and can include an inter-layer dielectric (e.g., an oxide or the like) disposed on the etch stop layer. The dielectric layer 180 has a planar top surface (e.g., distal from the semiconductor substrate 102).

One or more source contacts 182 are disposed through the dielectric layer 180 and contact the semiconductor-metal compound region 176 disposed on the source regions 162, 163, and integrated backgate region 168. One or more drain contacts 184 are disposed through the dielectric layer 180 and contact the semiconductor-metal compound region 176 disposed on the drain region 164. One or more backgate contacts 186 are disposed through the dielectric layer 180 and contact the semiconductor-metal compound region 176 disposed on the drain mirror region 166 and backgate region 170. Each of the source contacts 182, drain contacts 184, and backgate contacts 186 can include one or more barrier and/or adhesion layers (e.g., titanium nitride (TiN), tantalum nitride (TaN), the like, or a combination thereof) conformally in a respective opening through the dielectric layer 180, and can include a conductive fill material (e.g., a metal, such as tungsten (W), copper (Cu), a combination thereof, or the like).

A full pitch 192 is illustrated extending from a middle vertical axis of a source contact 182 to a middle vertical axis of another source contact 182 in the cross-section of FIG. 1A. A half pitch 194 is illustrated extending from a middle vertical axis of a source contact 182 to a middle vertical axis of a drain contact 184 in the cross-section of FIG. 1A. The full pitch 192 and the half pitch 194 may vary depending on the operating voltage rating of the LDMOS.

As noted above, the LDMOS illustrated in FIGS. 1A and 1B is an example. Other LDMOS structures incorporating aspects described herein may be implemented. For example, an integrated backgate may be omitted, and a different body region with a body contact may be implemented.

Figure 2:
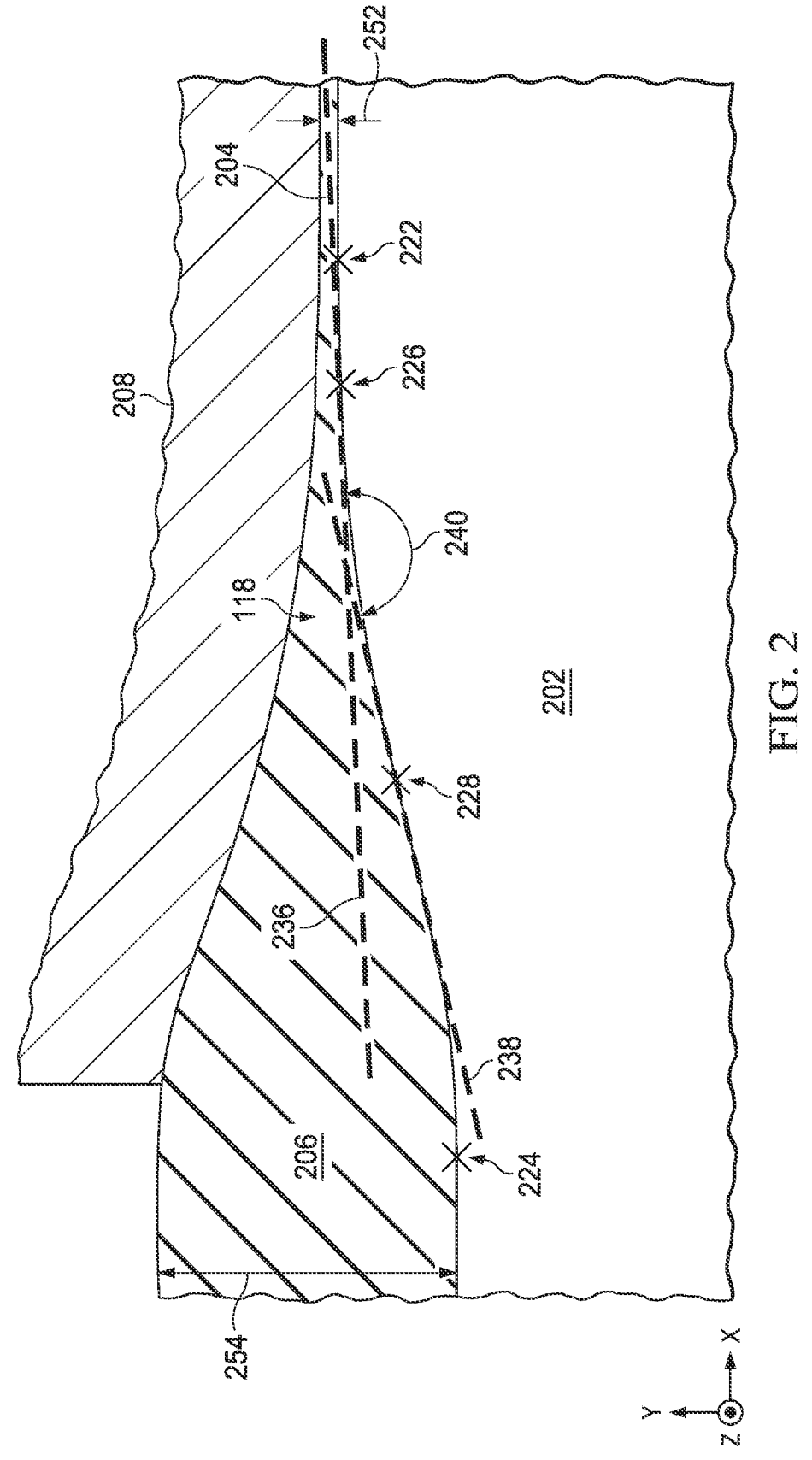
FIG. 2 is a cross-sectional view of a bird's beak region according to some examples.

FIG. 2 is a cross-sectional view of the bird's beak region 118 according to some examples. FIG. 2 shows a semiconductor substrate 202 (e.g., semiconductor substrate 102 in FIG. 1A), a dielectric oxide layer 204 (e.g., dielectric oxide layer 110), a field oxide region 206 (e.g., field oxide region 112, 114), and a gate electrode 208 (e.g., gate electrode 132, 134). A three axes coordinate system (e.g., x-y-z) is shown for convenience. The cross-section is in an x-y plane. The cross-section, for example, is along a direction (e.g., an x-direction in FIG. 2) from the field oxide region 206 to the dielectric oxide layer 204.

In the cross-section illustrated in FIG. 2, the semiconductor substrate 202 adjoins, at an interface, a lower surface of an edge region of the field oxide region 206 that connects to dielectric oxide layer 204. The lower surface extends along the lower portion of the edge region, which lower surface extends from the field oxide region 206 and to the dielectric oxide layer 204. The lower surface forms a surface of the bird's beak region 118 that connects the field oxide region 206 to the dielectric oxide layer 204.

Along the lower surface are a first point 222 and a second point 224. The bird's beak region 118 is laterally between the first point 222 and the second point 224. The first point 222 (i) is a point on the lower surface at the dielectric oxide layer 204 that is most laterally proximate to the field oxide region 206 and (ii) has a tangent line with respect to the lower surface that is parallel with a major top surface (e.g., an x-z plane in FIG. 2) of the semiconductor substrate 202. The major top surface of the semiconductor substrate 202 is generally the surface of the semiconductor substrate 202 in, on, and/or over which semiconductor devices (e.g., transistors) are formed and/or are disposed. The second point 224 (i) is a point on the lower surface at the field oxide region 206 that is most laterally proximate to the dielectric oxide layer 204 and (ii) has a tangent line with respect to the lower surface that is parallel with the major top surface of the semiconductor substrate 202. From another perspective, the first point 222 (i) is a point on the lower surface at the dielectric oxide layer 204 that is most laterally distal from the respective source region 162, 163 proximate the dielectric oxide layer 204 and (ii) has a tangent line with respect to the lower surface that is parallel with the major top surface of the semiconductor substrate 202. The second point 224 (i) is a point on the lower surface at the field oxide region 206 that is most laterally distal from the respective drain region 164 proximate the field oxide region 206 and (ii) has a tangent line with respect to the lower surface that is parallel with the major top surface of the semiconductor substrate 202.

In the cross-section, any and/or each pair of points along the lower surface between the first point 222 and the second point 224 have respective tangent lines with respect to the lower surface that intersect to form an angle generally downwardly facing the semiconductor substrate 202 that is equal to or greater than 150°. As an example, a first intermediate point 226 and a second intermediate point 228 are illustrated along the lower surface between the first point 222 and the second point 224. The first intermediate point 226 has a first tangent line 236 with respect to the lower surface, and the second intermediate point 228 has a second tangent line 238 with respect to the lower surface. The first tangent line 236 and the second tangent line 238 intersect to form an angle 240 that faces the semiconductor substrate 202. The angle 240 is equal to or greater than 150°. In the cross-section, no pair of points along the lower surface between the first point 222 and the second point 224 have respective tangent lines with respect to the lower surface that intersect to form an angle generally downwardly facing the semiconductor substrate 202 that is less than 150°.

In some examples, in the cross-section, any and/or each point along the lower surface between the first point 222 and the second point 224 has a tangent line with respect to the lower surface that has a slope with a magnitude equal to or less than 0.57735 (e.g., $\sqrt{3}/3$). The rise of the slope is in a direction normal to the top major surface of the semiconductor substrate 202 (e.g., in a y-direction in FIG. 2). In the cross-section, no point along the lower surface between the first point 222 and the second point 224 has a tangent line with respect to the lower surface that has a slope with a magnitude that exceeds 0.57735 (e.g., $\sqrt{3}/3$).

As illustrated, the dielectric oxide layer 204 has a thickness 252 (e.g., in a y-direction) laterally outside of the bird's beak region 118, and the field oxide region 206 has a thickness 254 laterally outside of the bird's beak region 118. The thickness 252 of the dielectric oxide layer 204 and the thickness 254 of the field oxide region 206 can vary depending on an operating voltage rating of the LDMOS.

The smooth transition illustrated in FIG. 2 from the field oxide region 206 to the dielectric oxide layer 204 can decrease an electric field of an LDMOS transistor. In an LDMOS transistor with a transition between a field oxide region and a dielectric oxide layer has a sharp angle, such as less than 120°, the electric field across the dielectric oxide layer at the sharp angle can be relatively large. With a smooth transition like shown in FIG. 2, the electric field across the bird's beak region 118 can be reduced by 30% or more relative to a structure with a sharp transition. A reduction in electric field can reduce channel hot carrier (CHC) effects and a rate of impact ionization. Further, a safe operating area (SOA) can be increased.

Also, breakdown voltage (BV) can increase for a given half pitch of an LDMOS transistor. In simulations, a 60% BV-Rsp tradeoff was observed for a given pitch. With a smooth transition like in FIG. 2, the simulated BV was approximately 60% or more greater than the simulated BV of an LDMOS transistor with a sharp transition. Further, an LDMOS transistor with a smooth transition like in FIG. 2 that had a same BV as an LDMOS transistor with a sharp transition had a smaller full pitch (and half pitch) and approximately 60% or more reduced Rsp compared to the LDMOS transistor with the sharp transition. Hence, according to some examples, the full pitch and/or half pitch of an LDMOS transistor can be decreased, and hence, obtain a decreased Rsp, while maintaining a higher BV.

FIGS. 3 through 16 illustrate cross-sectional views during a method of semiconductor processing to form the semiconductor device structure 100 of FIG. 1A. The cross-sectional views in FIGS. 3 through 16 show generally half of the semiconductor device structure 100 to more clearly illustrate aspects. The illustrated processing would likewise apply to the other half of the semiconductor device structure 100 due to the symmetry of the racetrack configuration. In other examples, the semiconductor device structure formed by FIGS. 3 through 16 may be a LDMOS that is not in a racetrack configuration (e.g., without applicable symmetry).

Figure 3:
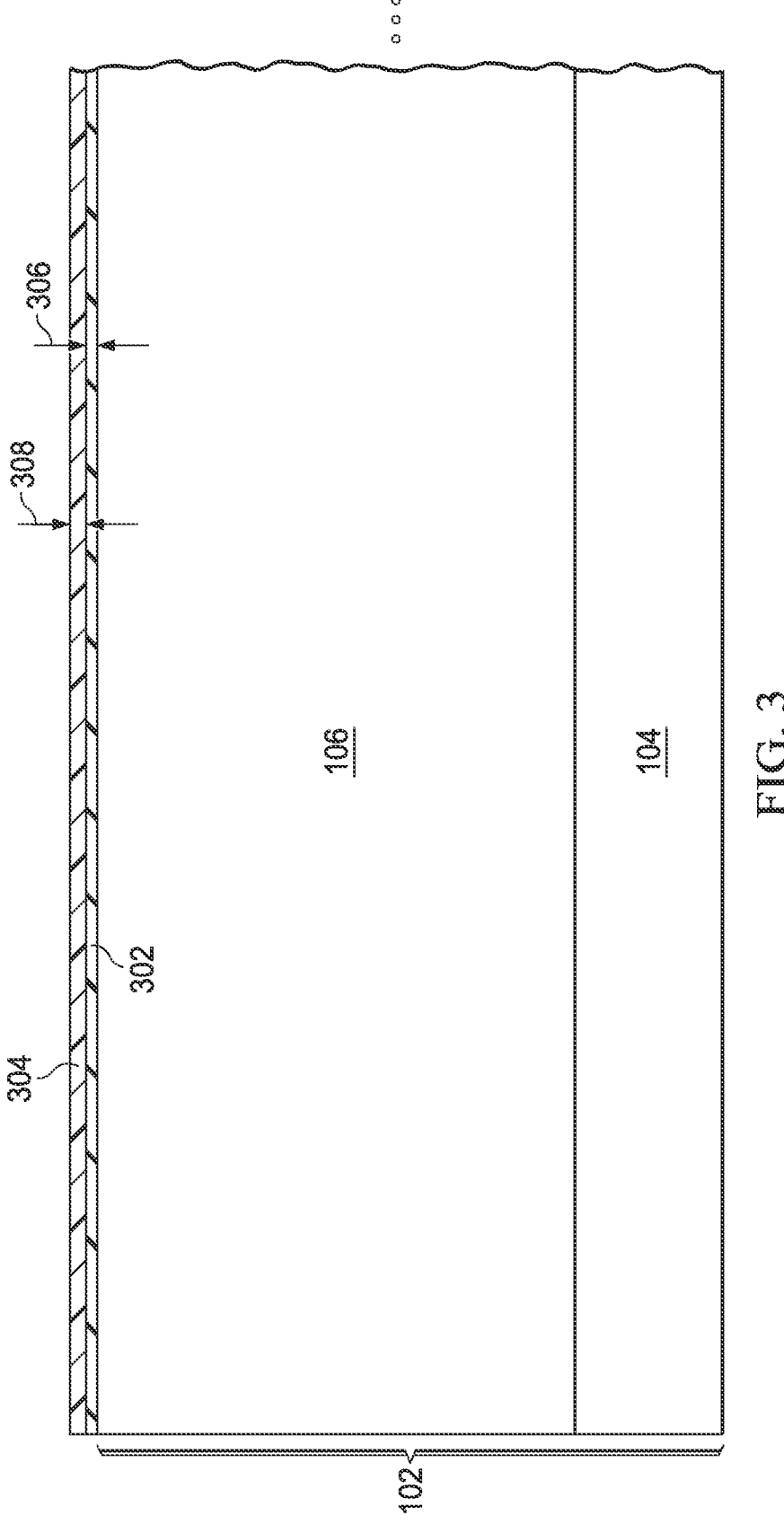
FIGS. 3 through 16 are cross-sectional views during a method of semiconductor processing to form the semiconductor device structure of FIG. 1A according to some examples.

Referring to FIG. 3, a semiconductor substrate 102 is provided. In the illustrated example, providing the semiconductor substrate 102 includes epitaxially growing an epitaxial layer 106 on a support substrate 104. The epitaxial growth can be performed by using any appropriate epitaxial growth process, such as low pressure chemical vapor deposition (LPCVD) or the like. In an example, the epitaxial layer 106 is silicon, and the support substrate 104 is a bulk silicon wafer. The epitaxial layer 106 may be undoped or may be doped (e.g., in situ during the epitaxial growth). Another semiconductor substrate can be used.

A pad oxide layer 302 is formed on a top major surface of the semiconductor substrate 102. In some examples, the pad oxide layer 302 is formed by performing an oxidation process to oxide the semiconductor material (e.g., silicon) at the top major surface of the semiconductor substrate 102. Hence, in such examples, the pad oxide layer 302 can be an oxide of the semiconductor material of the semiconductor substrate, such as silicon oxide. For example, the oxidation process can include a thermal oxidation performed at a temperature in a range from about 950° C. to about 1,050° C. while flowing a gas comprising oxygen ($O_2$), ozone ($O_3$), steam ($H_2O$), the like, or a combination thereof. In other examples, the pad oxide layer 302 can be deposited over the semiconductor substrate 102 using an appropriate deposition process, such as, for example, chemical vapor deposition (CVD), atomic layer deposition (ALD), or the like.

A mask layer 304 is formed over the pad oxide layer 302. The mask layer 304 may have an intrinsic stress. In some examples, the mask layer 304 is a nitride, such as silicon nitride. The mask layer 304 can be deposited by any appropriate deposition process, such as CVD.

The pad oxide layer 302 has a thickness 306, and the mask layer 304 has a thickness 308. The thickness 306 of the pad oxide layer 302 can be in a range from about 140 Angstroms to about 250 Angstroms, such as from about 200 Angstroms to about 250 Angstroms. The thickness 308 of the mask layer 304 can be in a range from about 400 Angstroms to about 2,000 Angstroms. A ratio of the thickness 308 of the mask layer 304 to the thickness 306 of the pad oxide layer 302 can be in a range from about 2 to about 6. The ratio of the thickness 308 of the mask layer 304 to the thickness 306 of the pad oxide layer 302 can be small while providing sufficient thickness 306 of the pad oxide layer 302 for reasons provided below. Additionally, the thicknesses 306, 308 can vary based on implementation, such as an operating voltage rating of the LDMOS.

Figure 4:
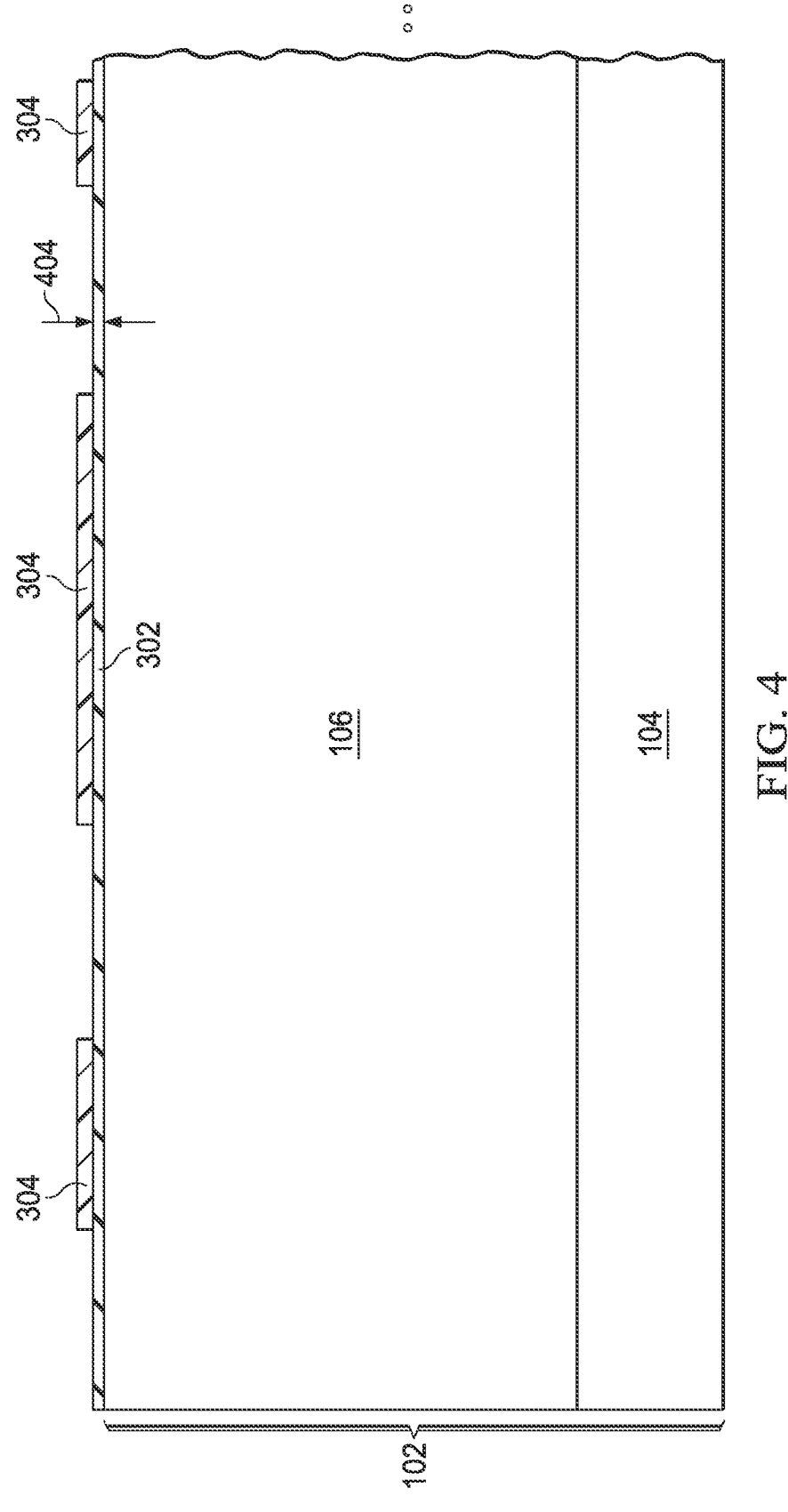

Referring to FIG. 4, the mask layer 304 is patterned. The mask layer 304 is patterned to expose areas of the pad oxide layer 302 where field oxide regions will be formed. In some examples, the pad oxide layer 302 can remain without being removed in areas underlying portions of the mask layer 304 that were removed. The mask layer 304 can be patterned using appropriate photolithography and etching processes.

In some examples, the etch process can be anisotropic (such as a reactive ion etch) or can be isotropic (such as a wet etch using phosphoric acid ($H_3PO_4$)).

In some examples, the etch process to pattern the mask layer 304 may etch the pad oxide layer 302 to some extent. In some examples, the etch process is selective to etch the mask layer 304 at a high rate and to etch the pad oxide layer 302 at a low rate. Hence, a small amount of the pad oxide layer 302 that results in being exposed through openings through the mask layer 304 by the etch process may also be etched by the etch process. The pad oxide layer 302 exposed through openings through the mask layer 304 has a thickness 404 following the etch process. The thickness 404, in some examples, is equal to or greater than 80 Angstroms, such as equal to or greater than 100 Angstroms.

Figure 5:
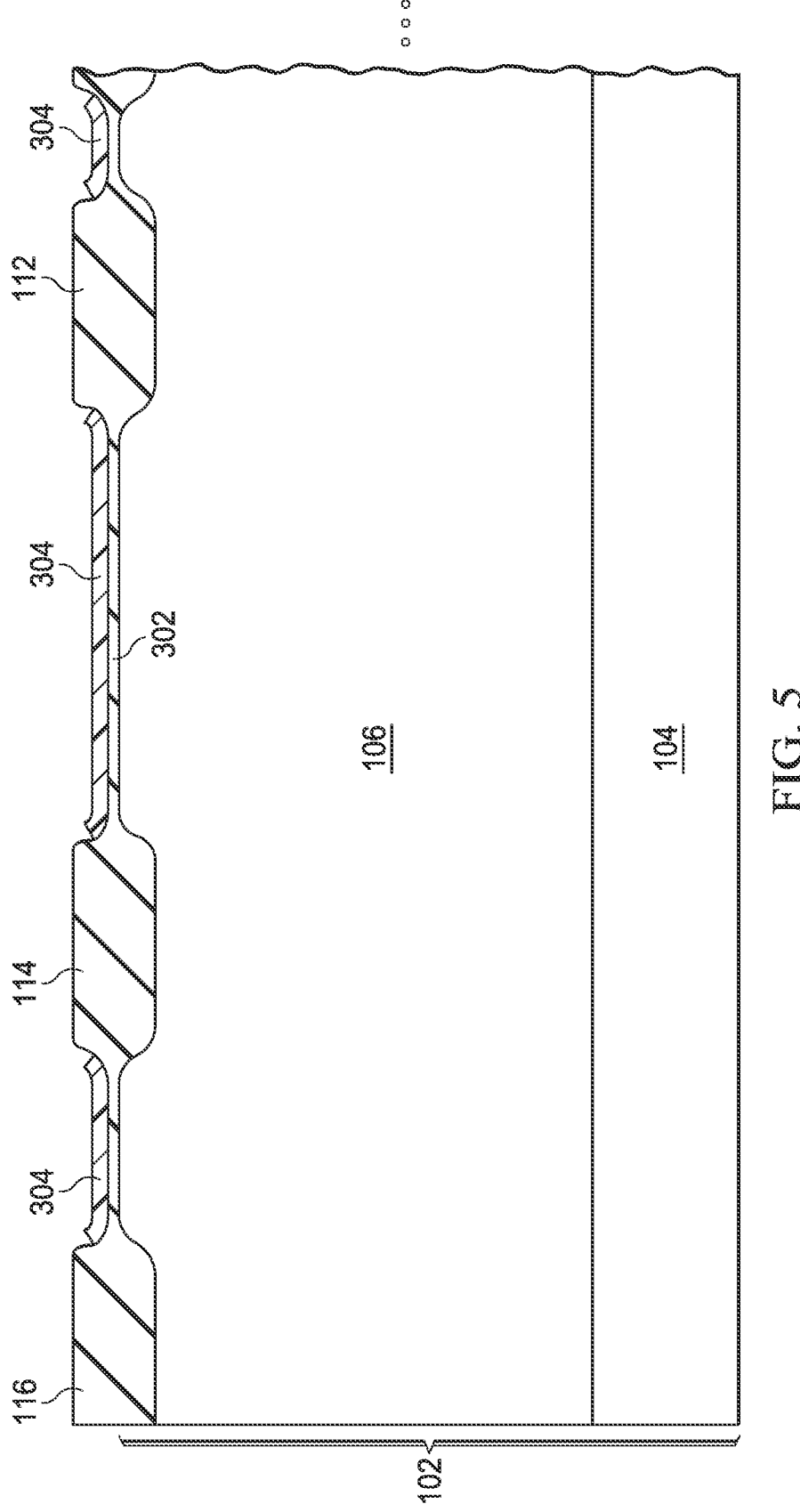

Referring to FIG. 5, an oxidation process is performed to form the field oxide regions 112, 114, 116. The oxidation process further oxidizes the semiconductor material (e.g., silicon) at the top major surface of the semiconductor substrate 102 to form the field oxide regions 112, 114, 116. Generally, openings through the mask layer 304 allow vertical penetration and diffusion of oxygen such that oxidation of the semiconductor material occurs at the openings. The presence of the mask layer 304 generally inhibits or reduces vertical penetration and diffusion of oxygen. However, oxygen may diffuse laterally from the openings to oxidize portions of the semiconductor material at edges of the openings and underlying the mask layer 304. This lateral diffusion and resulting oxidation forms, at least in part, the bird's beak regions 118. Among other things, the stress of the mask layer 304 coupled with the thickness of the pad oxide layer 302 allows lateral diffusion of oxygen to form the lower surface of the bird's beak regions 118 as described above with respect to FIG. 2. In some examples, the oxidation process can include a thermal oxidation performed at a temperature in a range from about 950° C. to about 1,050° C. while flowing a gas comprising oxygen ($O_2$), ozone ($O_3$), steam ($H_2O$), the like, or a combination thereof. The oxidation process may be referred to as local oxidation of semiconductor (LOCOS).

No sacrificial oxide formation and etch is performed in some examples. For example, the pad oxide layer 302 (having the thickness 404) remains exposed through openings through the mask layer 304 at the beginning of the oxidation process to form the field oxide regions 112, 114, 116, and the top surface of the semiconductor substrate 102 underlying the exposed portions of the pad oxide layer 302 is not etched after the formation of the pad oxide layer 302 and before the formation of the field oxide regions 112, 114, 116. The pad oxide layer 302 exposed through the openings is not wholly removed (e.g., by etch), and no sacrificial oxide regrowth and subsequent etch at the top portion of the semiconductor substrate 102 (that would be exposed through the openings) is performed before the oxidation process to form the field oxide regions 112, 114, 116. Using sacrificial oxide formation and etch can change the stress condition at the upper portion of the semiconductor substrate 102, which can lead to process variation. Avoiding sacrificial oxide formation and etch can reduce stress induced process variation. Other examples contemplate that such sacrificial oxide formation and etch may be performed.

The diffusivity of oxygen during the oxidation process to form the bird's beak regions 118 can be a function of stress, processing pressure, and processing temperature. A stress profile at the upper portion of the semiconductor substrate 102 and pad oxide layer 302 can be a function of temperature. The ratio of the thickness 308 of the mask layer 304 to the thickness 306 of the pad oxide layer 302 can affect the stress profile. The smaller the thickness 308 of the mask layer 304 and/or the smaller the ratio are can result in less stress. A lower stress at the upper portion of the semiconductor substrate 102 and the dielectric oxide layer 110 can permit a lower and more uniform rate of diffusivity of oxygen and a lower reaction rate for the formation of an oxide during the oxidation process, which can cause the smooth bird's beak region 118 to form. Similarly, a processing pressure (e.g., pressure of gas in the chamber in which the oxidation process is performed) can be a function of temperature. A processing pressure can result from a flow rate of one or more gases used for the oxidation process. The processing pressure can also be tuned to achieve a lower rate of diffusivity of oxygen and a lower reaction rate.

Figure 6:
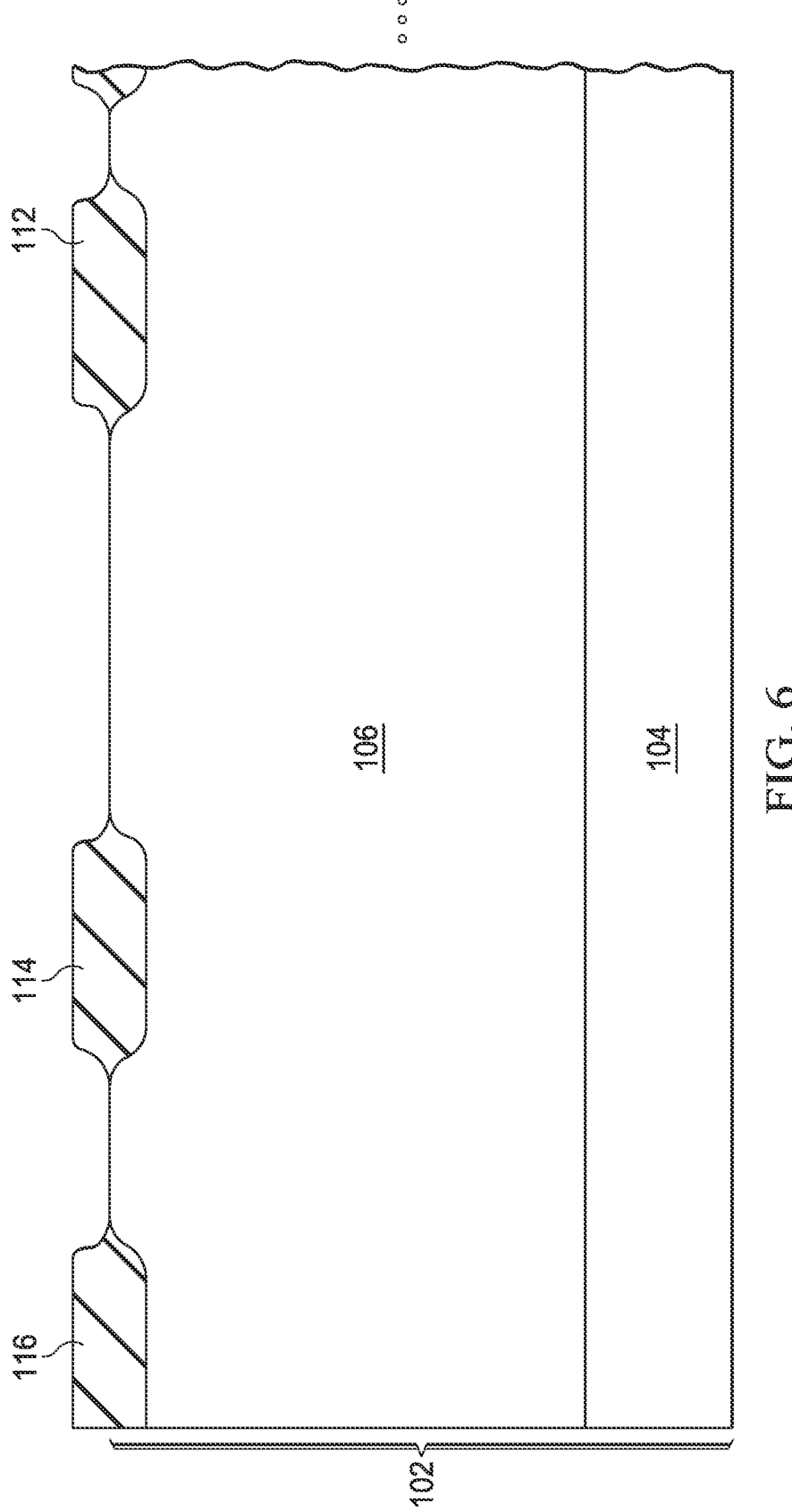

Referring to FIG. 6, the mask layer 304 and the pad oxide layer 302 are removed. For example, the mask layer 304 can be removed using an etch process, such as a wet etch using phosphoric acid ($H_3PO_4$), and the pad oxide layer 302 can be removed using an etch process, such as a wet etch using diluted hydrochloric acid (HCl). The removal of the pad oxide layer 302 may also cause some loss from upper portions of the field oxide regions 112, 114, 116.

Figure 7:
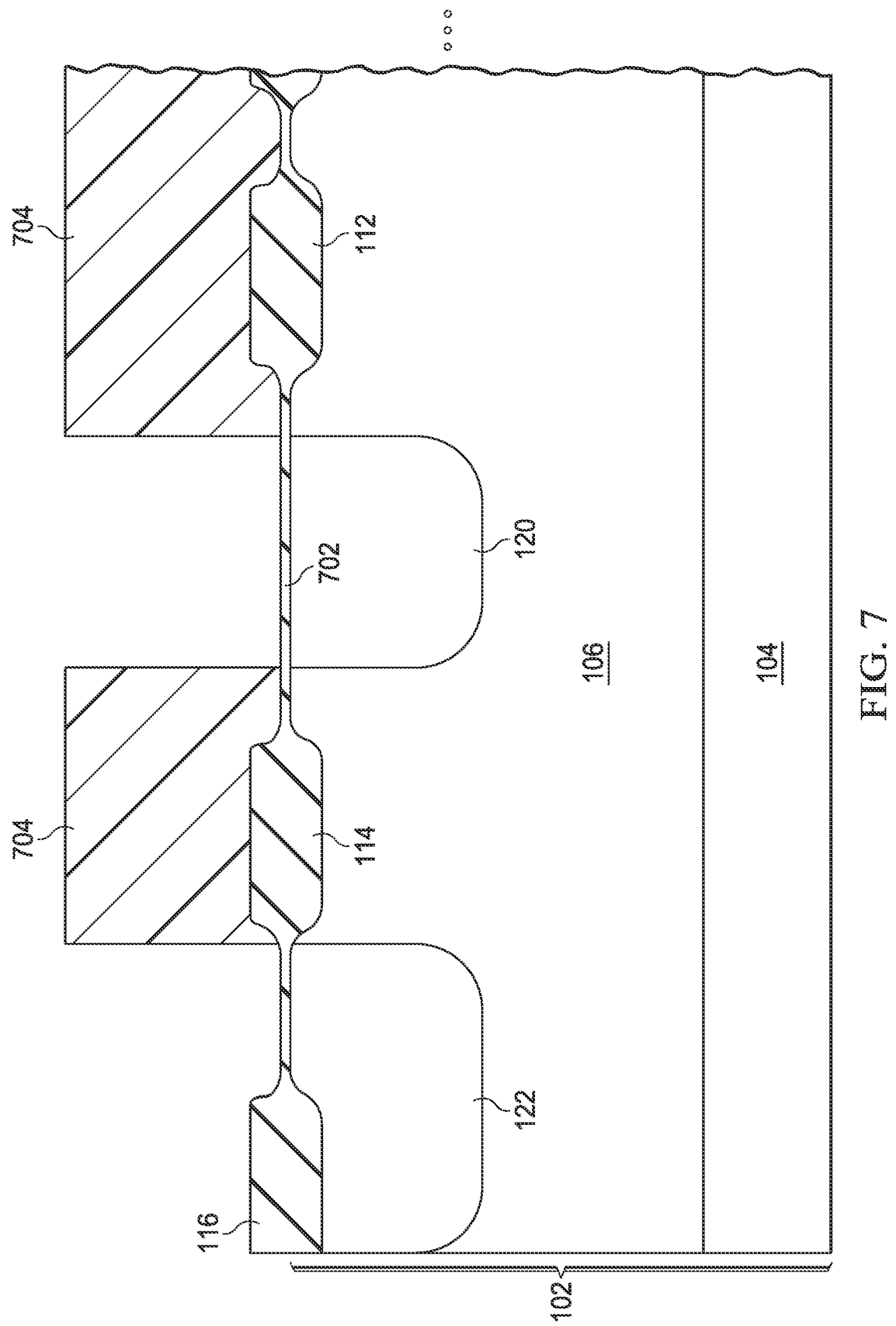

Referring to FIG. 7, a pad oxide layer 702 is formed on the top major surface of the semiconductor substrate 102. In some examples, the pad oxide layer 702 is formed by performing an oxidation process to oxide the semiconductor material (e.g., silicon) at the top major surface of the semiconductor substrate 102. Hence, in such examples, the pad oxide layer 702 can be an oxide of the semiconductor material of the semiconductor substrate, such as silicon oxide. The oxidation process can be like described above with respect to FIG. 3 for forming the pad oxide layer 302. In other examples, the pad oxide layer 702 can be deposited over the semiconductor substrate 102 using an appropriate deposition process, such as, for example, CVD, ALD, or the like.

Then, the counter-wells 120, 122 are formed in the semiconductor substrate 102. To form the counter-wells 120, 122, a photoresist 704 is deposited (e.g., by spin-on) over the semiconductor substrate 102 and patterned using photolithography. The photoresist 704 is patterned to have openings corresponding to areas where the counter-wells 120, 122 are to be formed. With the patterned photoresist 704, an implant is performed to implant dopants into the semiconductor substrate 102 thereby forming the counter-wells 120, 122. The dopant type and concentration of the counter-wells 120, 122 are as described above. After the implant, the photoresist 704 is removed, such as by ashing.

Figure 8:
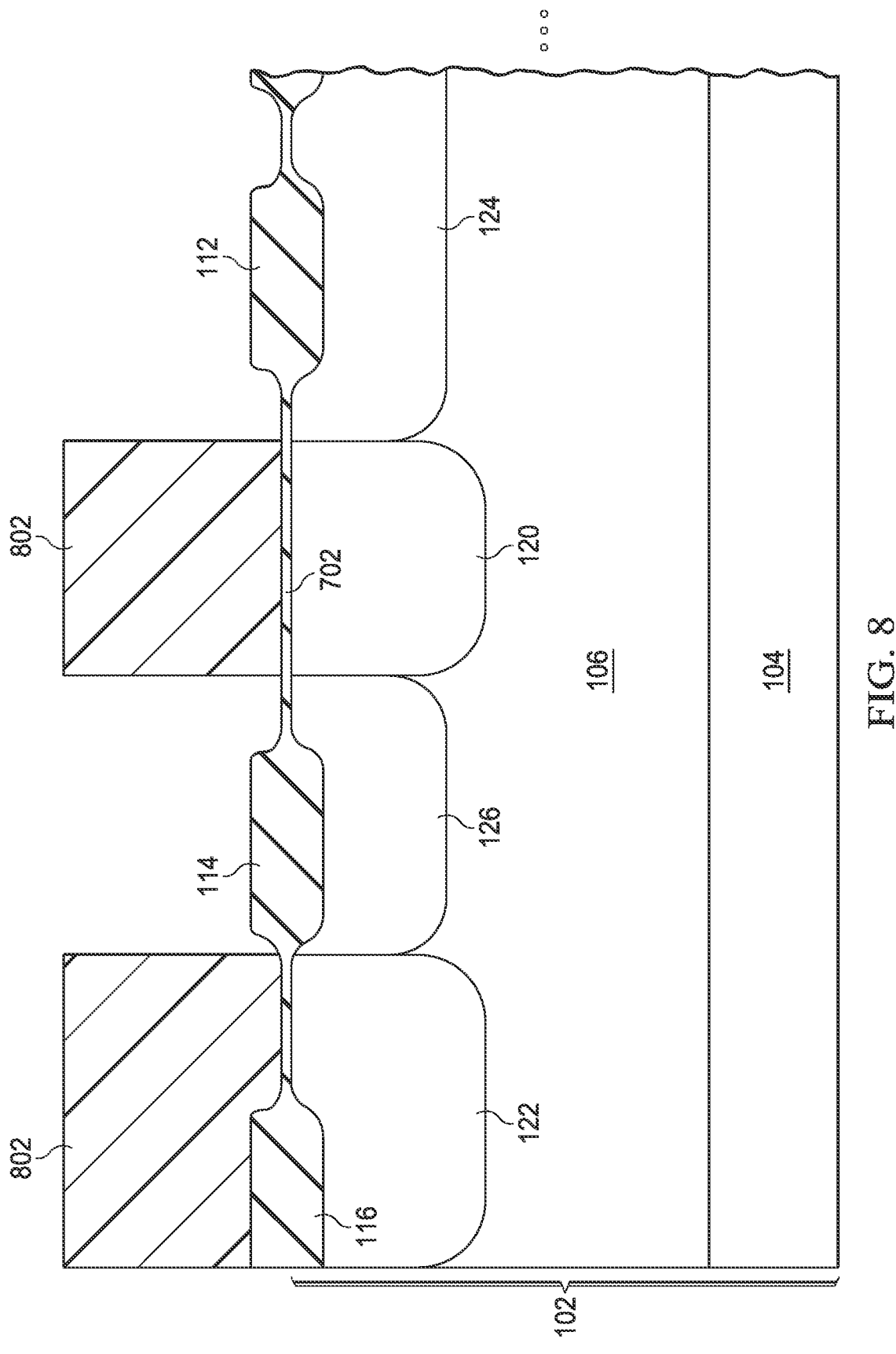

Referring to FIG. 8, the drift wells 124, 126 are formed in the semiconductor substrate 102. To form the drift wells 124, 126, a photoresist 802 is deposited (e.g., by spin-on) over the semiconductor substrate 102 and patterned using photolithography. The photoresist 802 is patterned to have openings corresponding to areas where the drift wells 124, 126 are to be formed. With the patterned photoresist 802, an implant is performed to implant dopants into the semiconductor substrate 102 thereby forming the drift wells 124, 126. The dopant type and concentration of the drift wells 124, 126 are as described above. After the implant, the photoresist 802 is removed, such as by ashing. An anneal process may be performed after the implantation to activate the dopants of the counter-wells 120, 122 and the drift wells 124, 126.

Figure 9:
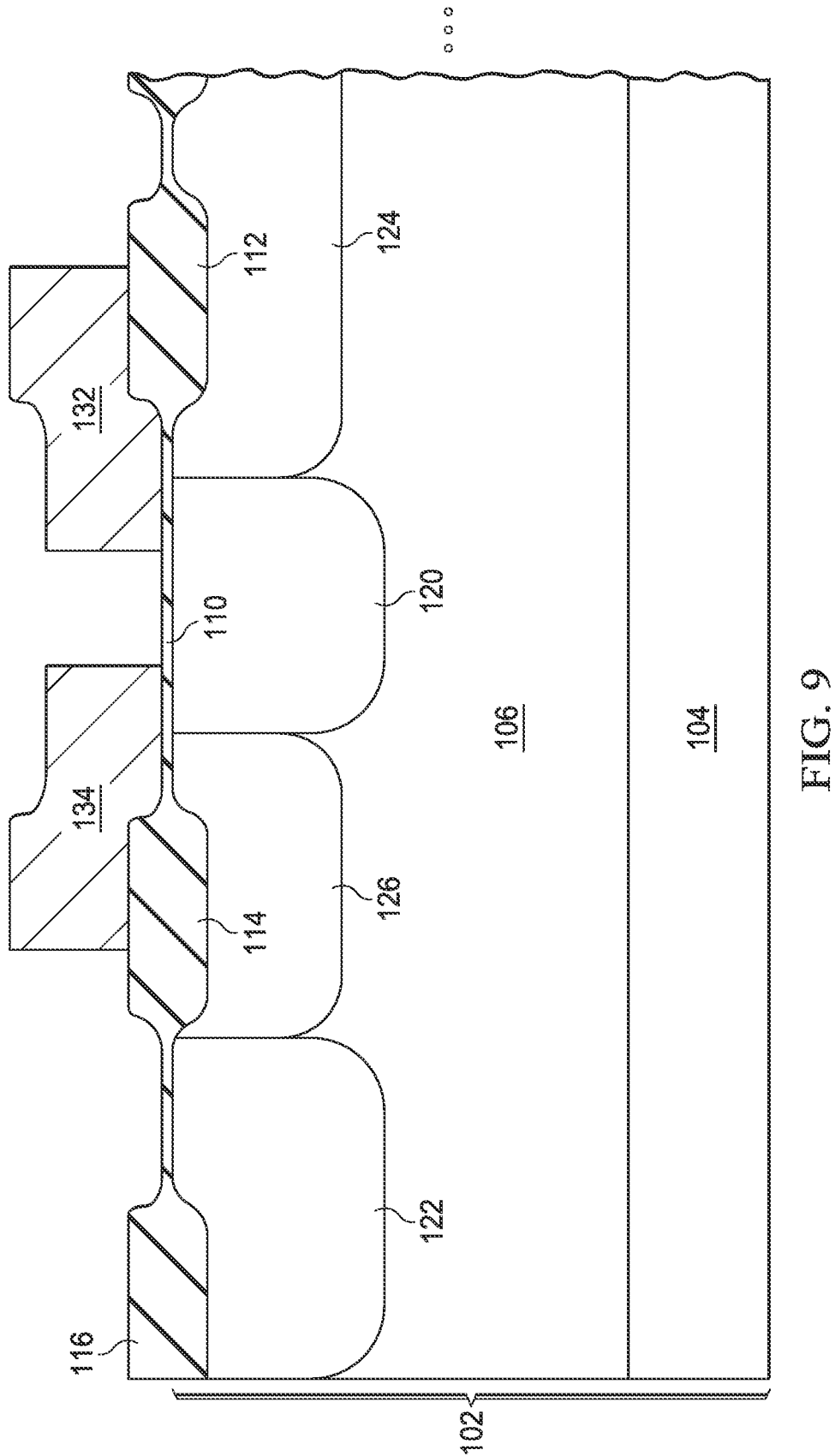

Referring to FIG. 9, the pad oxide layer 702 is removed. For example, the pad oxide layer 702 can be removed using an etch process, such as a wet etch using diluted hydrochloric acid (HCl). The removal of the pad oxide layer 702 may also cause some loss from upper portions of the field oxide regions 112, 114, 116.

Then, the dielectric oxide layer 110 is formed on the top major surface of the semiconductor substrate 102. In some examples, the dielectric oxide layer 110 is formed by performing an oxidation process to oxide the semiconductor material (e.g., silicon) at the top major surface of the semiconductor substrate 102. Hence, in such examples, the dielectric oxide layer 110 can be an oxide of the semiconductor material of the semiconductor substrate, such as silicon oxide. The oxidation process can be like described above with respect to FIG. 3 for forming the pad oxide layer 302. In other examples, the dielectric oxide layer 110 can be deposited over the semiconductor substrate 102 using an appropriate deposition process, such as, for example, CVD, ALD, or the like.

Gate electrodes 132, 134 are then formed. A material of the gate electrodes 132, 134 is deposited over the dielectric oxide layer 110 and field oxide regions 112, 114, 116. The material of the gate electrodes 132, 134 can be, for example, polysilicon, metal, the like, or a combination thereof. The material of the gate electrodes 132, 134 can be deposited by any appropriate deposition process, such as CVD, physical vapor deposition (PVD), or the like. The material of the gate electrodes 132, 134 is then patterned into the gate electrodes 132, 134 using appropriate photolithography and etching processes.

Figure 10:
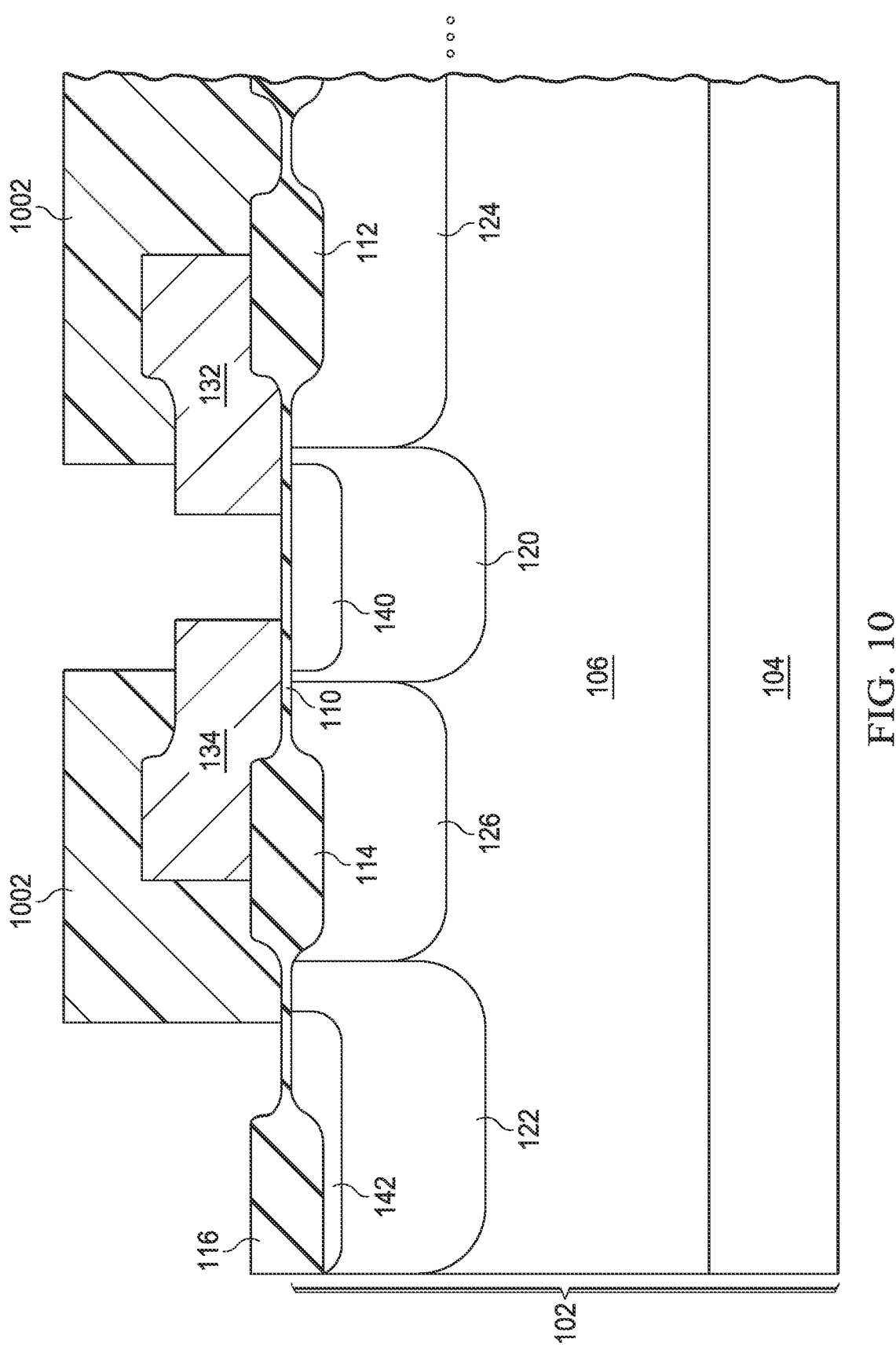

Referring to FIG. 10, the Dwells 140, 142 are formed in the semiconductor substrate 102. To form the Dwells 140, 142, a photoresist 1002 is deposited (e.g., by spin-on) over the semiconductor substrate 102 and patterned using photolithography. The photoresist 1002 is patterned to have respective openings corresponding to areas where the Dwells 140, 142 are to be formed. With the patterned photoresist 1002, an implant is performed to implant dopants into the semiconductor substrate 102 thereby forming the Dwells 140, 142. The dopant type and concentration of the Dwells 140, 142 are as described above. In some examples, the Dwells 140, 142 may be implanted to have a substantially uniform concentration in the illustrated Dwells 140, 142. In some examples, the implantation described with respect to FIG. 10 may form Dwells 140, 142 that have a depth equal to the depth of the counter-wells 120, 122. In some examples, the implantation described with respect to FIG. 10 may include multiple implantations, such as including an implantation to a shallow depth and another implantation to a deeper depth. In some examples, the implantation described with respect to FIG. 10 can form a doping concentration gradient between the illustrated Dwell 140 and the bottom boundary of the counter-well 120 (e.g., a decreasing doping concentration in the counter-well 120) and between the illustrated Dwell 142 and the bottom boundary of the counter-well 122 (e.g., a decreasing doping concentration in the counter-well 122).

Figure 11:
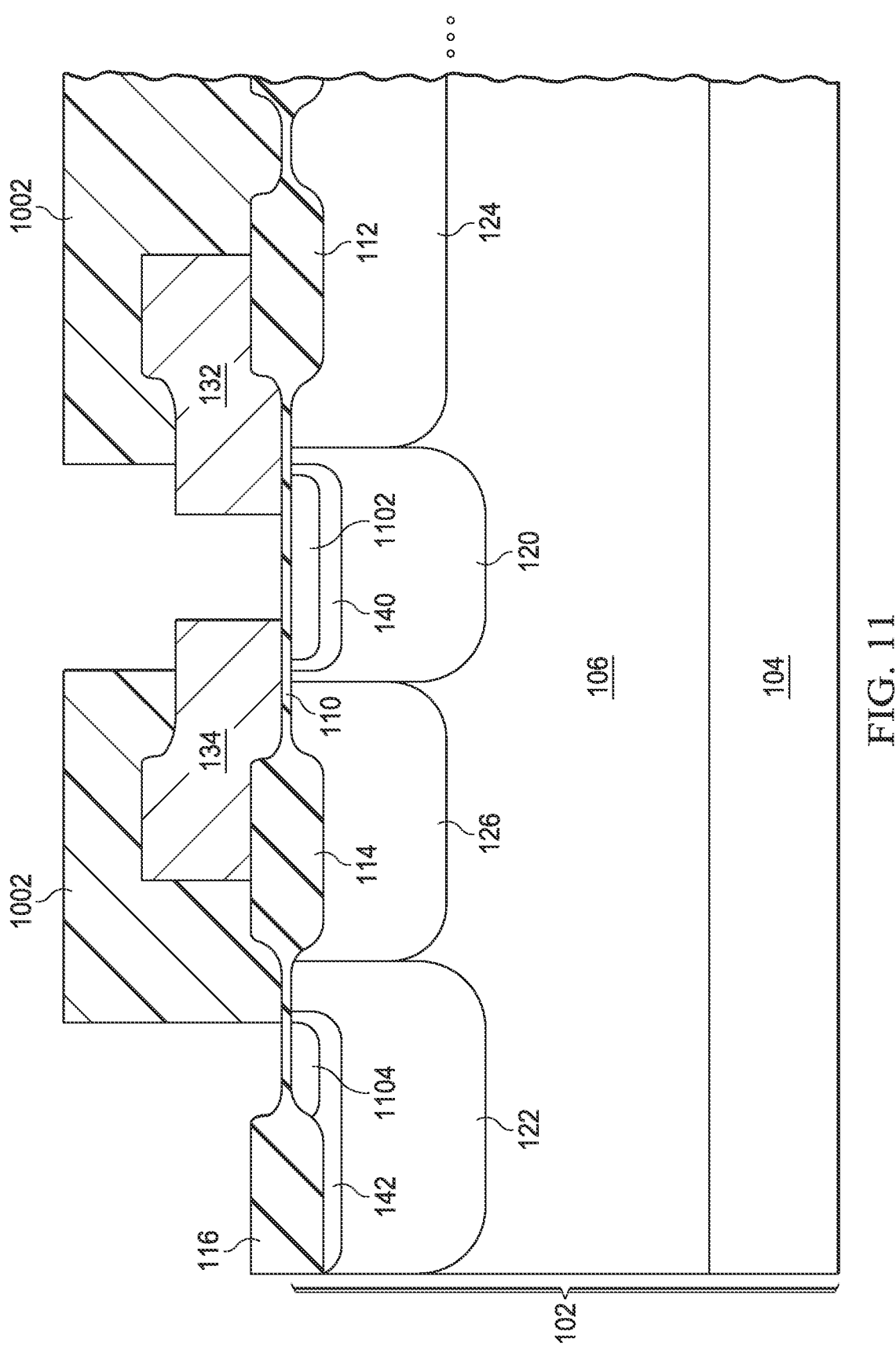

Referring to FIG. 11, intermediate regions 1102, 1104 are formed in the semiconductor substrate 102. With the patterned photoresist 1002, an implant is performed to implant dopants into the semiconductor substrate 102 thereby forming the intermediate regions 1102, 1104. The implant in FIG. 11 is using a dopant that has a same conductivity type as the source regions 162, 163 described above. The intermediate region 1102 is disposed in the Dwell 140 extending from a top surface of the semiconductor substrate 102 to a depth in the Dwell 140 in the semiconductor substrate 102. The intermediate region 1104 is disposed in the Dwell 142 extending from a top surface of the semiconductor substrate 102 to a depth in the Dwell 142 in the semiconductor substrate 102. In an n-channel LDMOS, the intermediate regions 1102, 1104 can be n-doped with an n-type dopant at a concentration in a range from about $1 \times 10^{20}$ cm$^{-3}$ to about $1 \times 10^{21}$ cm$^{-3}$. As described subsequently, the intermediate region 1102 is used to form the source regions 162, 163. After the implant, the photoresist 1002 is removed, such as by ashing.

Figure 12:
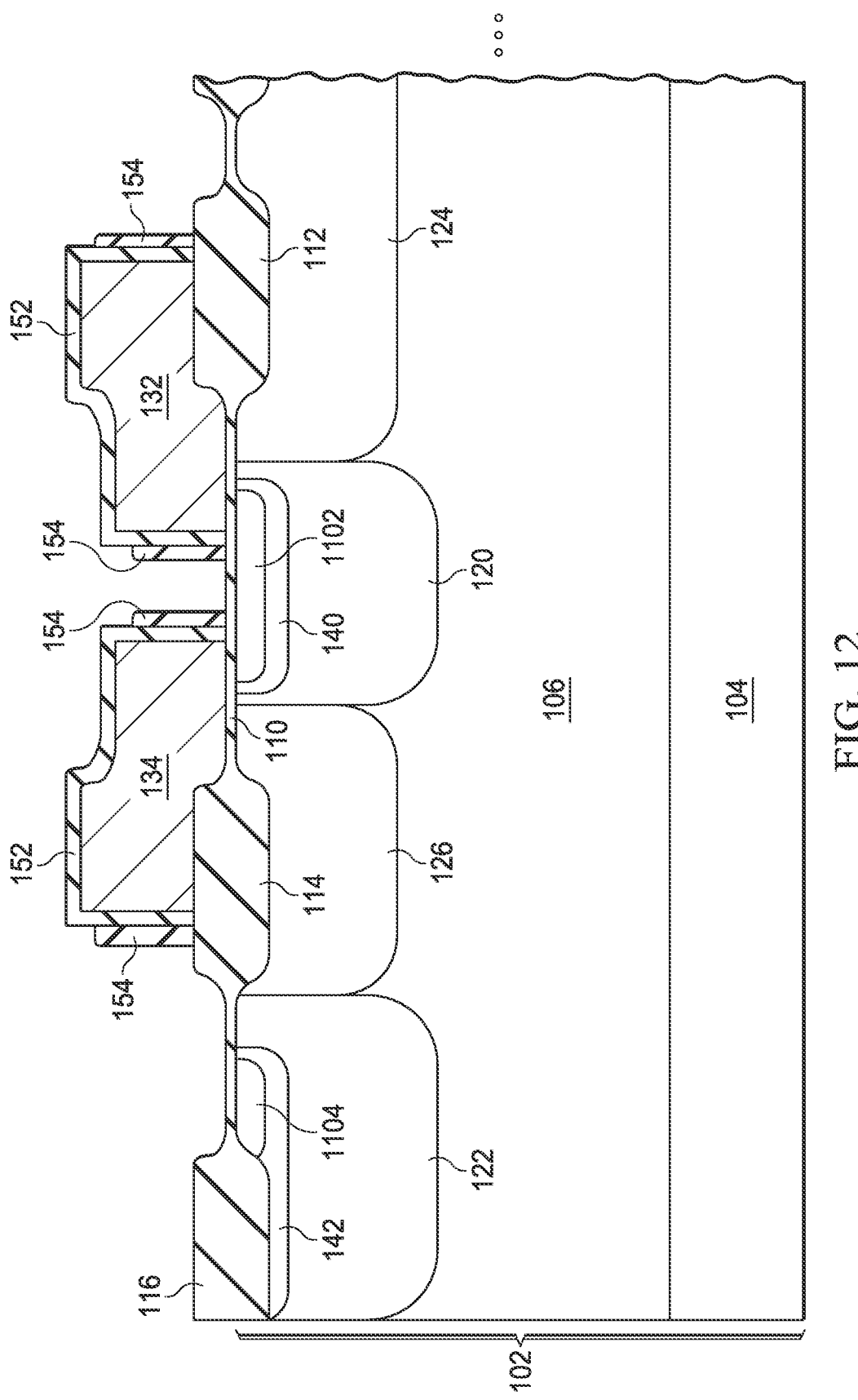

Referring to FIG. 12, a conformal oxide layer 152 is conformally formed on or over sidewall and upper surfaces of the gate electrodes 132, 134, and spacers 154 are formed on the conformal oxide layer 152 along sidewall surface of the gate electrodes 132, 134. In some examples, the conformal oxide layer 152 can be formed using an oxidation process to oxidize surfaces of the gate electrodes 132, 134. In some examples, the conformal oxide layer 152 can be formed by using an appropriate deposition process, such as CVD, ALD, or the like.

A material of spacers 154 is then conformally deposited on or over the conformal oxide layer 152 and on exposed surfaces of the dielectric oxide layer 110 and field oxide regions 112, 114, 116. The material of the spacers 154 is different from the material of the conformal oxide layer 152, and hence, can be selectively etched relative to the conformal oxide layer 152. The material of the spacers 154 can be or include any appropriate dielectric material, such as a nitride, the like, or a combination thereof, and can be deposited using an appropriate deposition process, such as CVD, ALD, or the like. The material of the spacers 154 is then anisotropically etched, such as by a reactive ion etch (RIE), to remove substantially lateral portions and such that spacers 154 remain on the conformal oxide layer 152 along sidewalls of the gate electrodes 132, 134.

Figure 13:
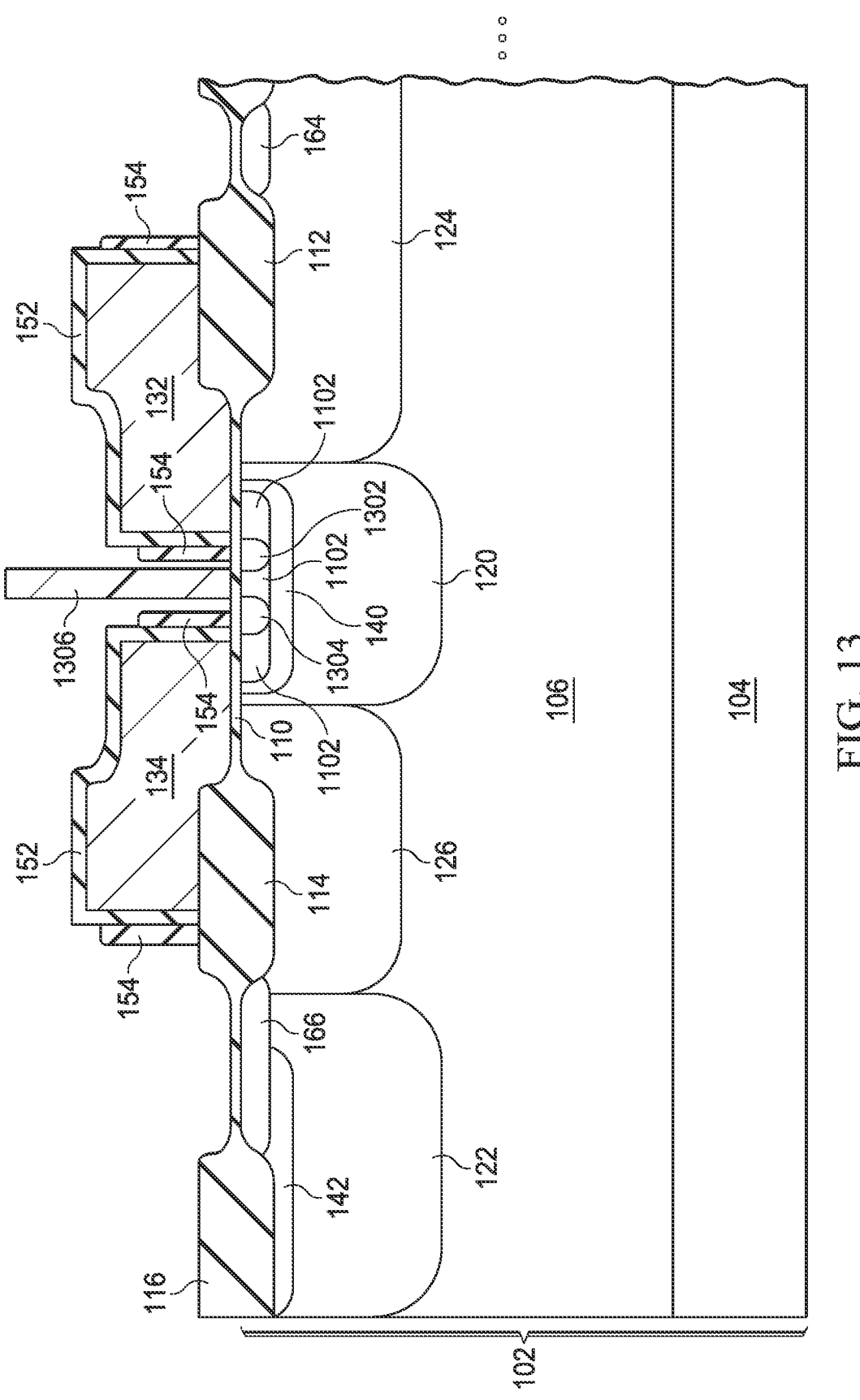

Referring to FIG. 13, intermediate regions 1302, 1304, drain region 164, and drain mirror region 166 are formed in the semiconductor substrate 102. To form the intermediate regions 1302, 1304, drain region 164, and drain mirror region 166, a photoresist 1306 is deposited (e.g., by spin-on) over the semiconductor substrate 102 and patterned using photolithography. The photoresist 1306 is patterned to mask where the integrated backgate region 168 will subsequently be formed. With the patterned photoresist 1306, an implant is performed to implant dopants into the semiconductor substrate 102 thereby forming the intermediate regions 1302, 1304, drain region 164, and drain mirror region 166. The dopant type and concentration of the drain region 164 and drain mirror region 166 (and hence, also the intermediate regions 1302, 1304) are as described above. The intermediate regions 1302, 1304 are disposed in the intermediate region 1102 extending from a top surface of the semiconductor substrate 102 to the depth of the intermediate region 1102 in the semiconductor substrate 102. As described subsequently, the intermediate region 1302 and the intermediate region 1102 will be further processed to form the source region 162, and the intermediate region 1304 and the intermediate region 1102 will be further processed to form the source region 163. It is noted that the intermediate region 1102 combines with the dopants implanted in FIG. 13 to form the drain mirror region 166. After the implant, the photoresist 1306 is removed, such as by ashing.

Figure 14:
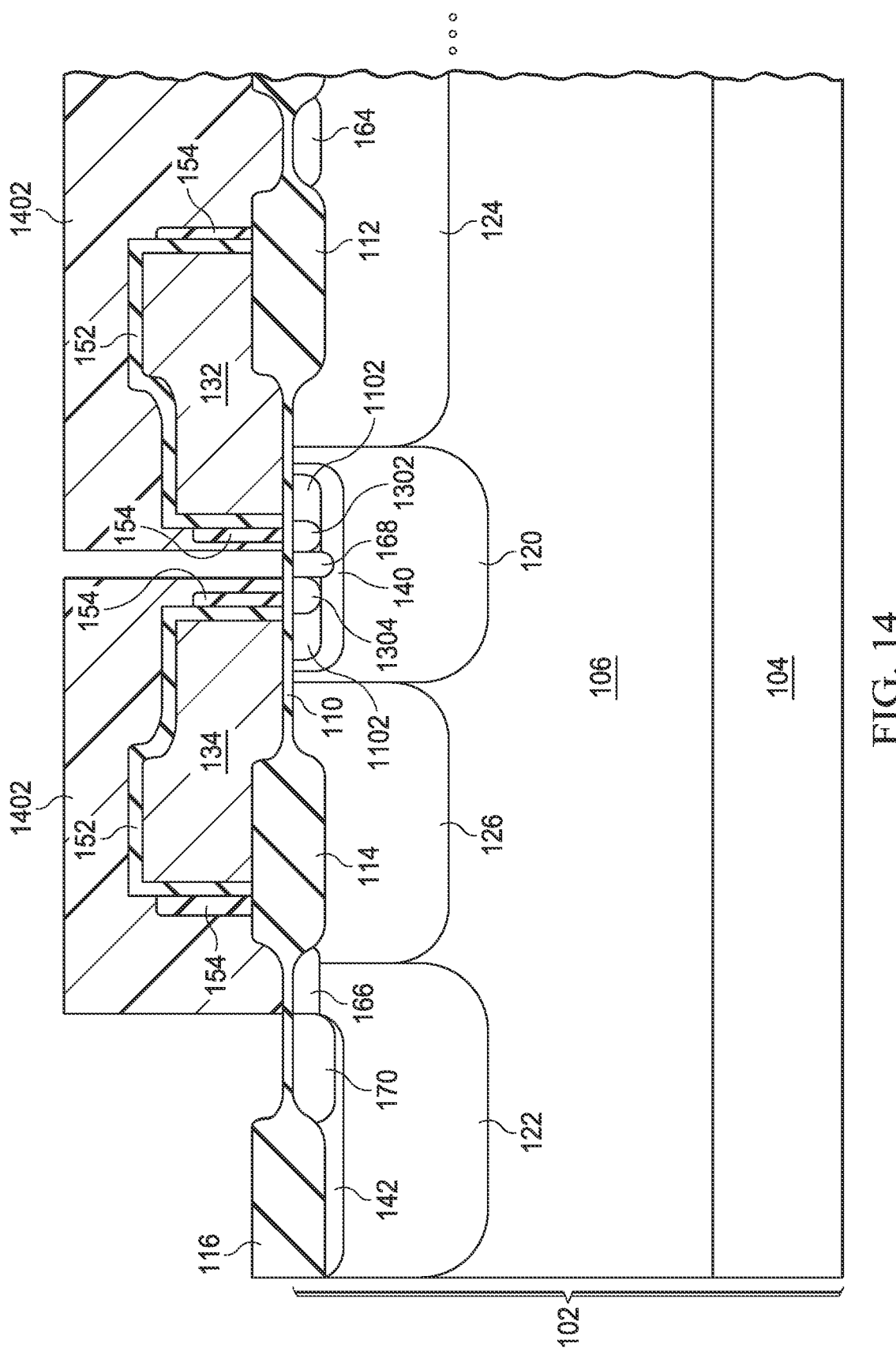

Referring to FIG. 14, the integrated backgate region 168 and backgate region 170 are formed in the semiconductor substrate 102. To form the integrated backgate region 168 and backgate region 170, a photoresist 1402 is deposited (e.g., by spin-on) over the semiconductor substrate 102 and patterned using photolithography. The photoresist 1402 is patterned to have openings corresponding to areas where the integrated backgate region 168 and backgate region 170 are to be formed. With the patterned photoresist 1402, an implant is performed to implant dopants into the semiconductor substrate 102 thereby forming the integrated backgate region 168 and backgate region 170. The dopant type and concentration of the backgate region 170 are as described above. After the implant, the photoresist 1402 is removed, such as by ashing.

Figure 15:
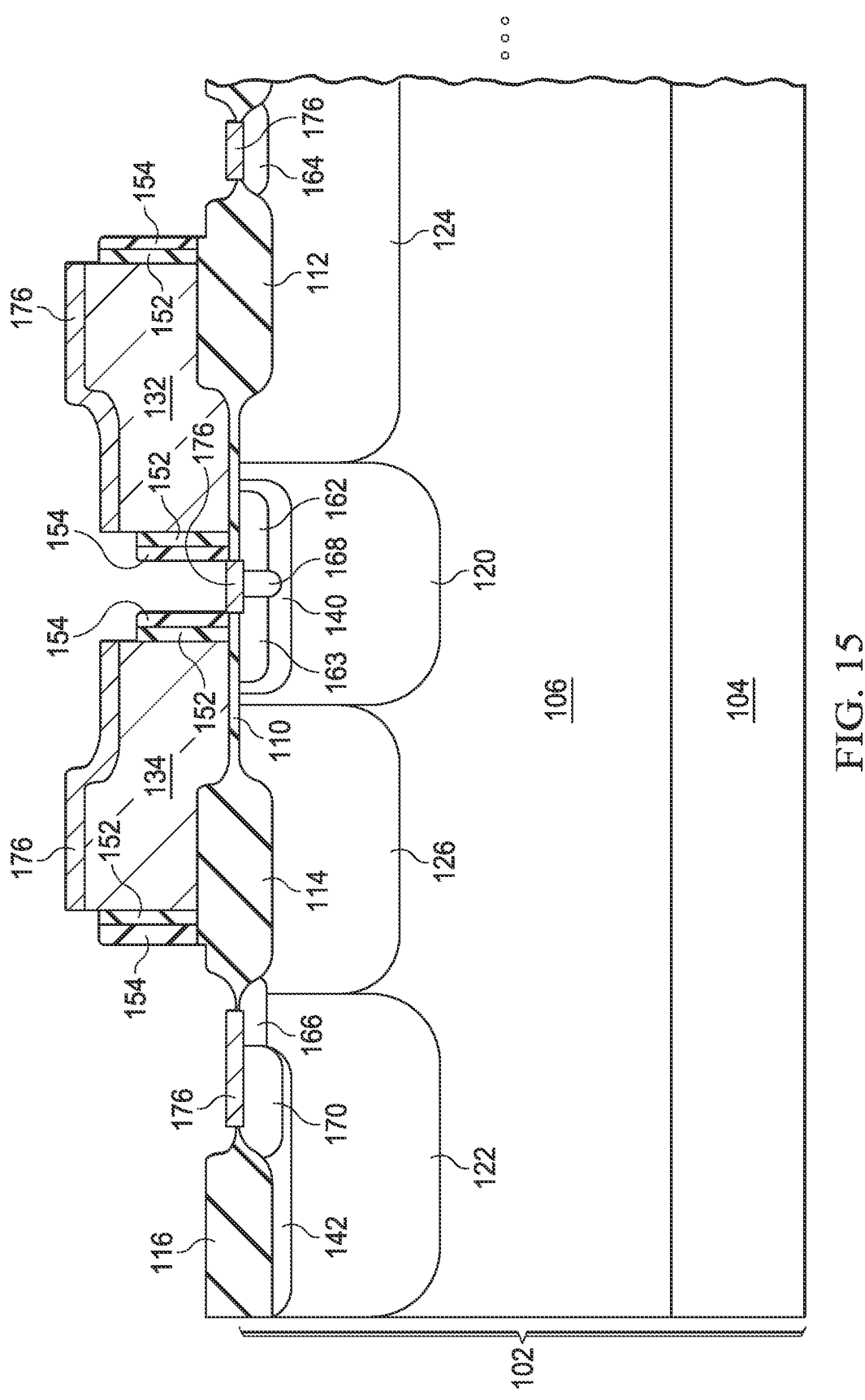

Referring to FIG. 15, an anneal process may be performed after the implantation of FIG. 14 to activate the dopants of the Dwells 140, 142, intermediate regions 1102, 1302, 1304, drain region 164, drain mirror region 166, integrated backgate region 168, and backgate region 170. As a result of the anneal process, dopants implanted to form the intermediate regions 1302, 1304 diffuse into the intermediate region 1102. As a result of the diffusion, the source regions 162, 163 are formed. The diffusion of dopants causes a dopant concentration gradient to be in the source regions 162, 163. The dopant concentration gradient in the source region 162 is decreasing in a direction from where the intermediate region 1302 was formed to a region underlying the gate electrode 132. The dopant concentration gradient in the source region 163 is decreasing in a direction from where the intermediate region 1304 was formed to a region underlying the gate electrode 134.

Semiconductor-metal compound regions 176 are formed. To form the semiconductor-metal compound regions 176, exposed portions of the dielectric oxide layer 110 and the conformal oxide layer 152 are removed. For example, the dielectric oxide layer 110 and the conformal oxide layer 152 can be removed using an etch process, such as a wet etch using diluted hydrochloric acid (HCl). The removal of portions of the dielectric oxide layer 110 and the conformal oxide layer 152 may also cause some loss from exposed upper portions of the field oxide regions 112, 114, 116. A metal of the semiconductor-metal compound regions 176 is deposited. The metal may be deposited using any appropriate deposition process, such as PVD, CVD, the like, or a combination thereof. An anneal process is implemented to react metal to underlying semiconductor material (e.g., silicon (Si)) to form the semiconductor-metal compound regions 176. A respective semiconductor-metal compound region 176 is therefore formed on the source regions 162, 163 and integrated backgate region 168, on the drain region 164, on the drain mirror region 166 and backgate region 170, on the gate electrode 132, and on the gate electrode 134. Unreacted metal is then removed, for example, using an etch process selective to the metal.

Figure 16:
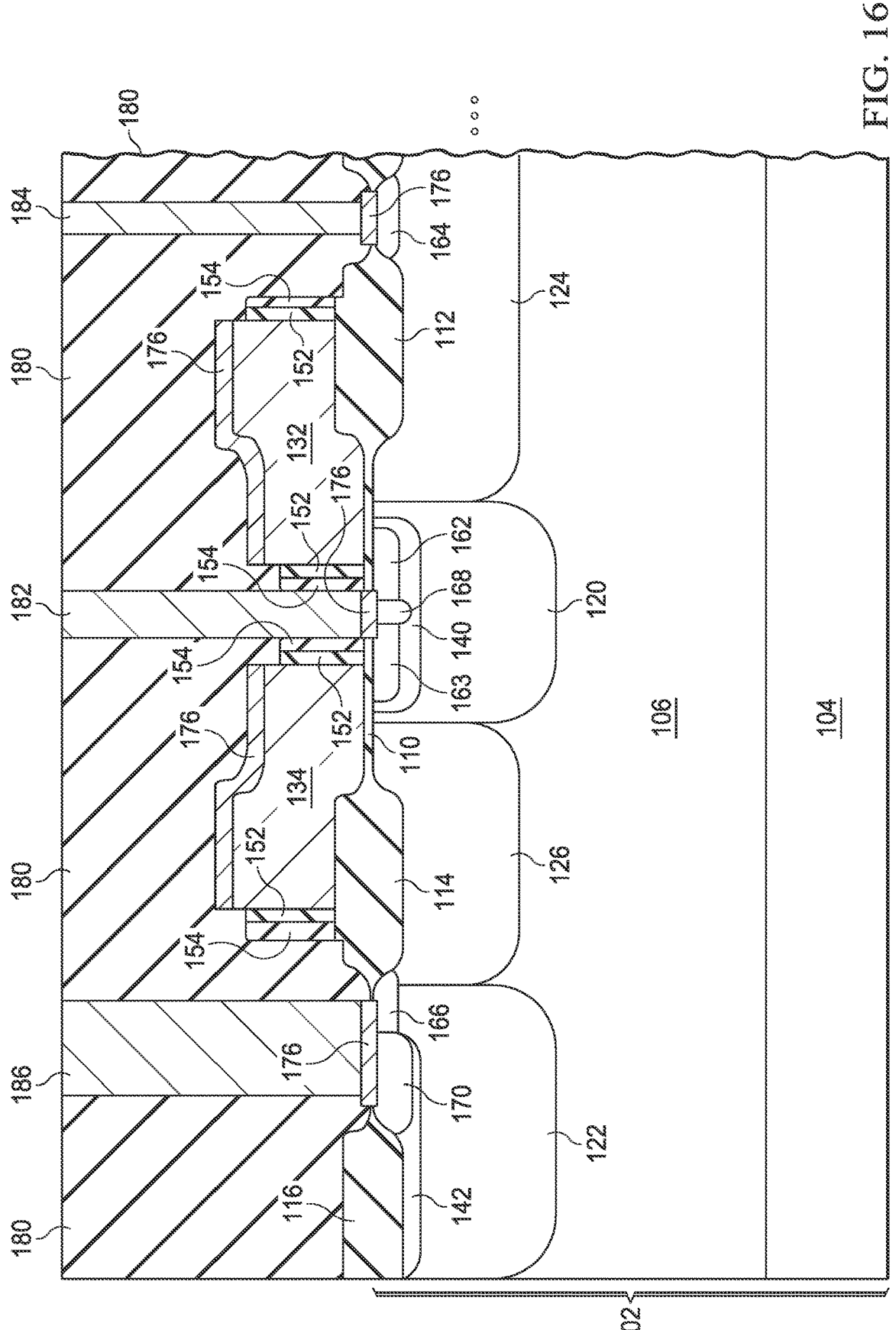

Referring to FIG. 16, the dielectric layer 180 is formed, and a source contact 182, drain contact 184, and backgate contact 186 are formed through the dielectric layer 180. The dielectric layer 180 can include one or multiple dielectric layers formed of any appropriate dielectric material and deposited by any appropriate deposition process, such as CVD, PVD, or the like. Openings are then formed through the dielectric layer 180 using photolithography and etching processes. Respective openings expose respective semiconductor-metal compound regions 176 that are disposed on the source regions 162, 163 and integrated backgate region 168, on the drain region 164, and on the drain mirror region 166 and backgate region 170. A barrier and/or adhesion layer may then be conformally deposited, such as by CVD, ALD, or the like, in the openings, and a fill metal can be deposited, such as by CVD, PVD, or the like, on the barrier and/or adhesion layer. Any barrier and/or adhesion layer and fill material on the top surface of the dielectric layer 180 may be removed by a chemical mechanical polish (CMP), for example. Hence, each of the source contact 182, drain contact 184, and backgate contact 186 can include a barrier and/or adhesion layer and a fill metal.

Although various examples have been described in detail, it should be understood that various changes, substitutions, and alterations can be made therein without departing from the scope defined by the appended claims.

What is claimed is:

1. A method of semiconductor processing, the method comprising:
   forming a pad oxide layer over a top surface of a semiconductor substrate;
   forming a patterned mask over the pad oxide layer, wherein part of the pad oxide layer is removed as a result of forming the patterned mask, and wherein a ratio of a thickness of the patterned mask to a thickness of a remaining portion of the pad oxide layer is greater than 5 and less than 25;
   forming a field oxide region using an oxidation process, the field oxide region being formed through an opening through the patterned mask that exposes the remaining portion of the pad oxide layer, wherein the oxidation process is performed through the remaining portion of the pad oxide layer; and
   forming a dielectric oxide layer over the top surface of the semiconductor substrate, the field oxide region being connected to the dielectric oxide layer through a bird's beak region.

2. The method of claim 1, wherein:
   a lower surface of the bird's beak region interfaces with the semiconductor substrate;
   in a cross-section along a direction from the field oxide region to the dielectric oxide layer, the lower surface of the bird's beak region does not have a slope with a magnitude that exceeds 0.57735; and
   rise of the slope is perpendicular to the top surface of the semiconductor substrate.

3. The method of claim 1, wherein the thickness of the remaining portion of the pad oxide layer is at least 80 Angstroms.

4. The method of claim 1, wherein a ratio of the thickness of the patterned mask to a thickness of the pad oxide layer underlying the patterned mask is in a range from 2 to 6.

5. The method of claim 1, wherein after forming the pad oxide layer, the semiconductor substrate where the field oxide region is to be formed is not etched.

6. The method of claim 1 further comprising, before forming the dielectric oxide layer, removing the pad oxide layer.

7. The method of claim 1 further comprising:
   forming a gate electrode disposed at least partially over the field oxide region and the dielectric oxide layer, the gate electrode being disposed over the bird's beak region.

8. The method of claim 1 further comprising:
   forming a source region disposed in the semiconductor substrate; and
   forming a drain region disposed in the semiconductor substrate, the dielectric oxide layer and the field oxide region being disposed laterally between the source region and the drain region.

9. The method of claim 1 further comprising forming a drift well disposed in the semiconductor substrate, the drift well being disposed along the bird's beak region.

10. The method of claim 1, wherein:

the pad oxide layer includes silicon oxide; and the patterned mask includes silicon nitride.

11. A method, comprising:

forming an oxide layer on a semiconductor substrate;

forming a patterned mask layer on the oxide layer, wherein part of the oxide layer is removed as a result of forming the patterned mask layer, a ratio of a thickness of the patterned mask layer to a thickness of a remaining portion of the oxide layer being greater than 5 and less than 25;

forming a field oxide region based on a thermal oxidation process performed through the remaining portion of the oxide layer, wherein the field oxide region is formed through an opening in the patterned mask layer that exposes the remaining portion of the oxide layer;

removing the oxide layer and the patterned mask layer after forming the field oxide region; and forming a dielectric oxide layer over the semiconductor substrate, the field oxide region being connected to the dielectric oxide layer through a bird's beak region.

12. The method of claim 11, wherein:

the oxide layer includes silicon oxide; and the patterned mask layer includes silicon nitride.

13. The method of claim 11, wherein:

a lower surface of the bird's beak region interfaces with the semiconductor substrate, wherein the lower surface of the bird's beak region does not have a slope with a magnitude that exceeds 0.57735 in a cross-section along a direction from the field oxide region to the dielectric oxide layer.

14. The method of claim 11, wherein the thickness of the remaining portion of the oxide layer is at least 80 Angstroms.

15. The method of claim 11, wherein a ratio of the thickness of the patterned mask layer to a thickness of the oxide layer underlying the patterned mask layer is in a range from 2 to 6.

16. The method of claim 11, wherein after forming the oxide layer, the semiconductor substrate where the field oxide region is to be formed is not etched.

17. The method of claim 11, wherein after forming the oxide layer and prior to forming the field oxide region, the semiconductor substrate where the field oxide region is to be formed is not further oxidized.

18. A method, comprising:

forming a silicon oxide layer on a silicon substrate;

forming a patterned silicon nitride layer on the silicon oxide layer, wherein part of the silicon oxide layer is removed as a result of forming the patterned silicon nitride layer, a ratio of a thickness of the patterned silicon nitride layer to a thickness of a remaining portion of the silicon oxide layer being greater than 5 and less than 25;

forming a field oxide region based on a thermal oxidation process performed through the remaining portion of the silicon oxide layer, wherein the field oxide region is formed through an opening in the patterned silicon nitride layer that exposes the remaining portion of the silicon oxide layer;

removing the silicon oxide layer and the patterned silicon nitride layer after forming the field oxide region; and forming a dielectric oxide layer over the silicon substrate, the field oxide region being connected to the dielectric oxide layer through a bird's beak region.

19. The method of claim 18, wherein the thickness of the remaining portion of the silicon oxide layer is at least 80 Angstroms.

20. The method of claim 18, wherein a ratio of the thickness of the patterned silicon nitride layer to a thickness of the silicon oxide layer underlying the patterned silicon nitride layer is in a range from 2 to 6.

21. The method of claim 18, wherein after forming the silicon oxide layer, the silicon substrate where the field oxide region is to be formed is not etched.

22. The method of claim 18, wherein after forming the silicon oxide layer and prior to forming the field oxide region, the silicon substrate where the field oxide region is to be formed is not further oxidized.

* * * * *